(12) United States Patent
Okuyama et al.

(10) Patent No.: US 8,928,009 B2
(45) Date of Patent: Jan. 6, 2015

(54) LIGHT EMITTING DEVICE, ILLUMINATING DEVICE, AND DISPLAY DEVICE

(75) Inventors: Hiroyuki Okuyama, Kanagawa (JP); Katsuhiro Tomoda, Kanagawa (JP); Naoki Hirao, Kanagawa (JP)

(73) Assignee: Sony Corporation, Tokyo (JP)

( * ) Notice: Subject to any disclaimer, the term of this patent is extended or adjusted under 35 U.S.C. 154(b) by 462 days.

(21) Appl. No.: 13/332,635

(22) Filed: Dec. 21, 2011

(65) Prior Publication Data

US 2012/0169786 A1 Jul. 5, 2012

(30) Foreign Application Priority Data

Jan. 5, 2011 (JP) ................................ P2011-000634

(51) Int. Cl.
- *H01L 33/00* (2010.01)
- *H01L 25/075* (2006.01)
- *H01L 33/62* (2010.01)
- *H01L 33/54* (2010.01)

(52) U.S. Cl.
CPC ............ *H01L 25/0753* (2013.01); *H01L 33/62* (2013.01); *H01L 33/54* (2013.01); *H01L 2224/16225* (2013.01); *H01L 2224/32225* (2013.01); *H01L 2224/73204* (2013.01)
USPC .................................. 257/86; 257/72; 257/88

(58) Field of Classification Search
None
See application file for complete search history.

(56) References Cited

U.S. PATENT DOCUMENTS

2008/0081400 A1  4/2008  Doi et al.
2009/0256494 A1*  10/2009  Nishinaka et al. ............ 315/291

FOREIGN PATENT DOCUMENTS

| JP | 2004-273596 | 9/2004 |
|---|---|---|
| JP | 3641122 | 1/2005 |

* cited by examiner

*Primary Examiner* — Julio J Maldonado
*Assistant Examiner* — Joseph Galvin, III
(74) *Attorney, Agent, or Firm* — Dentons US LLP

(57) ABSTRACT

A light emitting device includes: one or plural light emitting elements having plural electrodes; a chip-like insulator surrounding the one or plural light emitting elements from a side surface side of the one or plural light emitting elements; and plural terminal electrodes electrically connected one-to-one with the plural electrodes, and having protrusions each protruding from a peripheral edge of the chip-like insulator.

18 Claims, 28 Drawing Sheets

LIGHT EMITTING DEVICE, ILLUMINATING DEVICE, AND DISPLAY DEVICE

BACKGROUND

The present disclosure relates to a light emitting device including one or plural light emitting elements, and an illuminating device and a display device each including the light emitting device.

In recent years, a light emitting diode (LED) display device using an LED in a display pixel has got much attention as a lightweight and thin display device. The features of the LED display device include: the LED display device has not a view angle dependency with which a contrast or a color shade is changed depending on a viewing angle; and a response speed when a color is changed is fast. However, it is required for the LED display device that several millions of LED chips are mounted on a wiring substrate in a high yield, and are connected to one another with wirings. Therefore, a method that can achieve high yield of LED chips in a simple process is desired.

Heretofore, for example, a method is disclosed such that LED chips are held on a resin layer lying on a transfer substrate, a wiring substrate is stuck to the transfer substrate from a side of the resin layer on which the LED chips are kept held, and peeling is carried out in an interface between the resin layer and the transfer substrate, thereby collectively transferring the LED chips onto the wiring substrate. This method, for example, is disclosed in Japanese Patent Laid-Open No. 2004-273596.

In addition, for example, it is expected that package type light emitting devices in each of which one LED chip is disposed on a surface of a thin base member having two electrode pads on a surface thereof, and the one LED chip is encapsulated with a protective member are mounted on a wiring substrate in a matrix. This technique, for example, is disclosed in Japanese Patent No. 3641122.

SUMMARY

Now, when electrodes of the LED chips are formed on an upper surface and a lower surface separately from each other in the method disclosed in Japanese Patent Laid-Open No. 2004-273596, wires are used for electrical connection between the electrodes on the upper surface side of the LED chips, and the wiring substrate. In addition, in the case as well of the technique disclosed in Japanese Patent No. 3641122, wires are used for the electrical connection between the two electrodes on the surface of the base material, and the wiring substrate. For this reason, when the characteristics of the individual LED chips are desired to be measured after completion of the mounting, it is necessary to cause cantilevers to come in contact with the respective electrode of the light emitting element while the wires are avoided. Therefore, there is caused a problem that it is not easy to measure the characteristics of the individual LED chips after completion of the mounting.

In addition, in the case where in the method disclosed in Japanese Patent Laid-Open No. 2004-273596, the electrodes of the LED chip are formed on the upper surface and the lower surface of the LED chip separately from one another, when the characteristics of the individual LED chips are desired to be measured before the mounting, it is necessary to cause the cantilevers to come in contact with the respective electrodes of the LED chip from both surface sides of the upper surface and the lower surface of the LED chip. Therefore, in this case, there is caused a problem that it is not easy to measure the characteristics of the individual LED chips before the mounting. In addition, the technique disclosed in Japanese Patent No. 3641122 involves a problem as well that when only the lower surface of the light emitting device is exposed in the case where the light emitting device is temporarily jointed to the transfer substrate or the like, it may be impossible to measure the characteristics of the individual LED chips before the mounting.

The present disclosure has been made in order to solve the problems described above, and it is therefore desirable to provide a light emitting device in which characteristics of individual light emitting elements can be measured irrespective of before mounting and after the mounting, and an illuminating device and a display device each including the light emitting device.

In order to attain the desire, according to an embodiment of the present disclosure, there is provided a light emitting device including: one or plural light emitting elements having plural electrodes; a chip-like insulator surrounding the one or plural light emitting elements from at least a side surface side of the one or plural light emitting elements; and plural terminal electrodes electrically connected one-to-one with the plural electrodes, and having protrusions each protruding from a peripheral edge of the chip-like insulator.

According to another embodiment of the present disclosure, there is provided an illuminating device including plural light emitting devices mounted onto a substrate. Each of the plural light emitting devices includes: one or plural light emitting elements having plural electrodes; a chip-like insulator surrounding the one or plural light emitting elements from at least a side surface side of the one or plural light emitting elements; and plural terminal electrodes electrically connected one-to-one with the plural electrodes, and having protrusions each protruding from a peripheral edge of the chip-like insulator; and the protrusions are electrically connected to the substrate through a wiring layer.

According to still another embodiment of the present disclosure, there is provided a display device including: a display panel having plural pixels; and a drive circuit driving the plural pixels in accordance with a video signal, in which the plural pixels included in the display panel include plural light emitting devices mounted onto a substrate. Each of the light emitting devices includes: one or plural light emitting elements having plural electrodes; a chip-like insulator surrounding the one or plural light emitting elements from at least a side surface side of the one or plural light emitting elements; and plural terminal electrodes electrically connected one-to-one with the plural electrodes, and having protrusions each protruding from a peripheral edge of the chip-like insulator; and the protrusions are electrically connected to the substrate through a wiring layer.

In the light emitting device, the illuminating device, and the display device according to the embodiments of the present disclosure, the plural terminal electrodes electrically connected to the plural electrodes of the plural light emitting elements, respectively, are provided with the protrusions each protruding from the peripheral edge of the chip-like insulator. For this reason, the terminal electrode is exposed from any side of an upper surface side and a lower surface side of the light emitting device.

As set forth hereinabove, according to the embodiments of the present disclosure, the protrusions exposed from any side of the upper surface side and the lower surface side of the light emitting device are provided in the terminal electrodes, respectively. Therefore, when the light emitting device is mounted to the substrate, the protrusions of the terminal electrodes can be used for the electrical connection between the light emitting device and the substrate. As a result, since the light emitting device can be mounted to the substrate without using any of the wires, it is unnecessary to cause the cantilevers to come in contact with the respective terminal electrodes of the light emitting device while the wires are avoided. Therefore, it is possible to readily measure the characteristics of the individual light emitting elements after completion of the mounting. In addition, the protrusions of the terminal electrodes are exposed from any side of the upper surface side and the lower surface side of the light emitting device. Therefore, the cantilevers can be caused to come in contact with the respective terminal electrodes of the light emitting device from any side of the upper surface side and the lower surface side of the light emitting device. As a result, for example, even when one electrode of the light emitting element is formed on each of the upper surface side and the lower surface side of the light emitting element, the cantilevers can be caused to come in contact with the protrusions of the terminal electrodes electrically connected to the electrodes of the light emitting element, respectively, either from the upper surface side of the light emitting device, or from the lower surface side of the light emitting device. Therefore, it is possible to readily measure the characteristics of the individual light emitting elements before the mounting. As described above, in the present disclosure, it is possible to simply measure the characteristics of the individual light emitting elements irrespective of before the mounting or after the mounting.

DETAILED DESCRIPTION OF THE PREFERRED EMBODIMENTS

Embodiments of the present disclosure will be described in detail hereinafter with reference to the accompanying drawings. It is noted that the description will be given in accordance with the following order:

1. First Embodiment (Light Emitting Device)
the case where three light emitting elements are covered with a thin resin;
2. Changes (Light Emitting Device)
the case where a curved surface is provided on an upper surface of a resin
the case where irregularities are provided in a side surface of a resin
the case where a bump is provided in a terminal electrode
the case where the side surface of the resin is covered with a metal
the case where an upper surface of the resin is covered with a protective film
the case where the light emitting device has the different number of light emitting elements
the case where the light emitting device has the light emitting element having a different shape
the case where the light emitting device has the light emitting element having electrodes in different positions
the case where the light emitting device has the light emitting elements having a different layout within the light emitting device;
3. Second Embodiment (Display Device)
the case where the light emitting device of the first embodiment or a change thereof is used in a display pixel; and
4. Third Embodiment (Illuminating Device)
the case where the light emitting device of the first embodiment or the change thereof is used in a light source.

<1. First Embodiment>

[Structure]

Figure 1A:
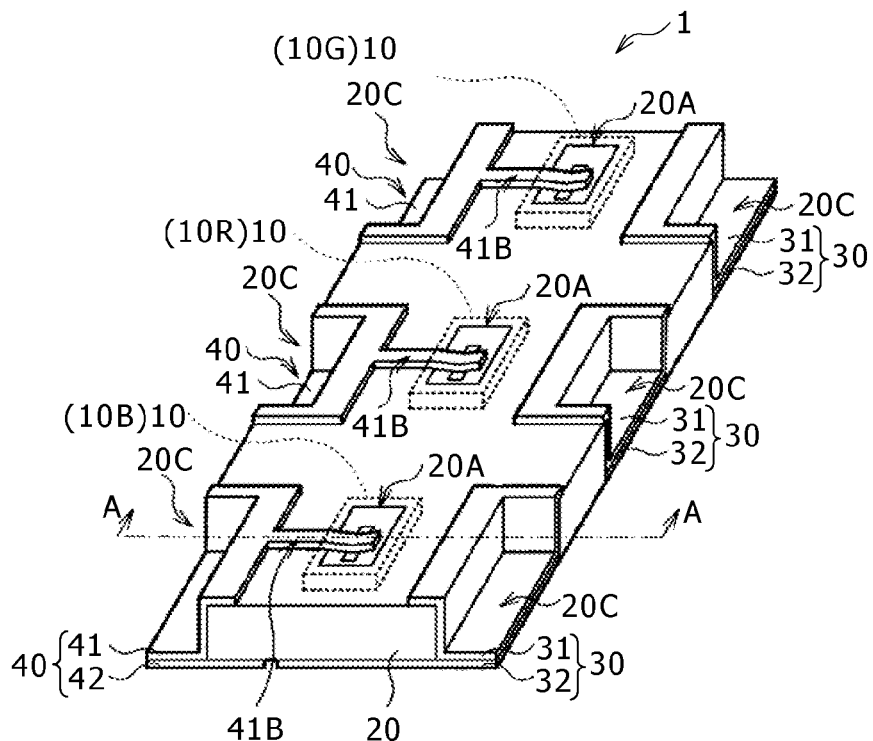
FIGS. 1A and 1B are respectively a perspective view showing a structure of a light emitting device according to a first embodiment of the present disclosure, and a cross sectional view taken on line A-A of FIG. 1A.
Figure 1B:
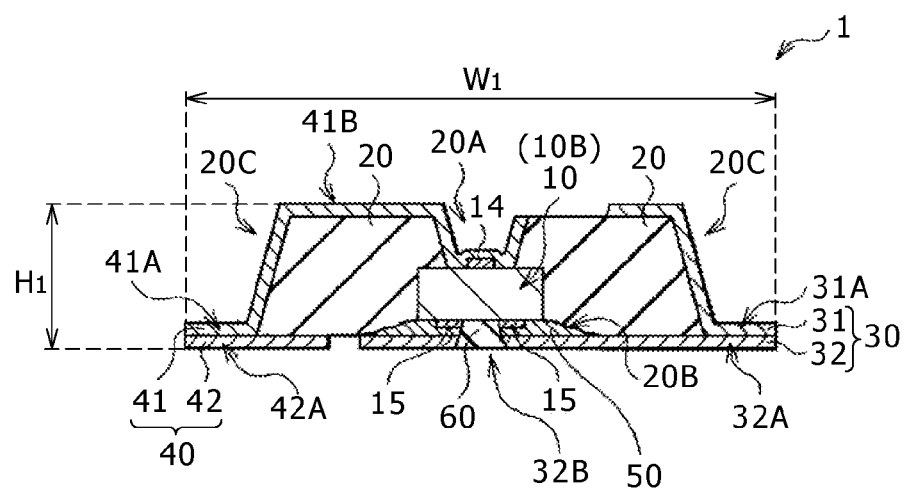

Firstly, a light emitting device 1 according to a first embodiment of the present disclosure will be described with reference to FIGS. 1A and 1B. FIG. 1A perspectively shows a schematic structure of the light emitting device 1. FIG. 1B shows a cross-sectional structure of the light emitting device 1 when viewed from a direction indicated by a line A-A of FIG. 1A. The light emitting device 1 can be suitably applied as a display pixel of a display device called a so-called LED display device and is a minute package in which plural light emitting elements are covered with a thin resin.

(Light Emitting Element 10)

The light emitting device 1, as shown in FIG. 1A, includes three light emitting elements 10. The three light emitting elements 10 are solid-state light emitting elements for emitting lights having predetermined wavelength bands from their upper surfaces, respectively. Specifically, each of the three light emitting elements 10 is an LED chip. The LED chips mean chips which are cut out from a wafer used for crystal growth, and thus each of the LED chips means that it is not a chip of a package type which is covered with a molded resin or the like. The LED chip, for example, is not smaller than 5 μm and not greater than 100 mm in size, and is called, as we say, a micro-LED. A planar shape of the LED chip, for example, is approximately a square. The LED chip has a thin section shape. An aspect ratio (a height $H_2$/a width $W_2$) (refer to FIG. 2) of the LED chip, for example, is not smaller than 0.1 and is smaller than 1.0.

The light emitting elements 10 are disposed within the light emitting device 1 and, for example, as shown in FIG. 1A, are disposed in a line at predetermined intervals from other light emitting elements 10. A gap defined between the two light emitting elements 10 adjacent to each other, for example, is equal to or greater than the size of each of the light emitting elements 10. It is noted that the gap described above may be narrower than the size of each of the light emitting elements 10 in some cases. An interval between the light emitting element 10 and the side surface of the light emitting device 1, for example, is set ½ or more of the size of each of the light emitting elements 10.

The three light emitting elements 10 emit lights having wavelength bands different from one another, respectively. For example, as shown in FIG. 1A, the three light emitting elements 10 are composed of the light emitting element 10G for emitting the light having the green color wavelength band, the light emitting element 10R for emitting the light having the red color wavelength band, and the light emitting element 10B for emitting the light having the blue color wavelength band. The light emitting element 10G, for example, is disposed in the vicinity of a side portion of the light emitting device 1. The light emitting element 10B, for example, is disposed in the vicinity of a side portion, being different from the side portion to which the light emitting element 10G comes close, of the side portions of the light emitting device 1. The light emitting element 10R, for example, is disposed between the light emitting element 10G and the light emitting element 10B. It is noted that although the positions of the three light emitting elements 10R, 10G, and 10B are by no means limited to the positions described above, in the following description, a positional relationship among other constituent elements will be described on the assumption that the three light emitting elements 10R, 10G, and 10B are disposed in the positions exemplified above in some cases.

Figure 2:
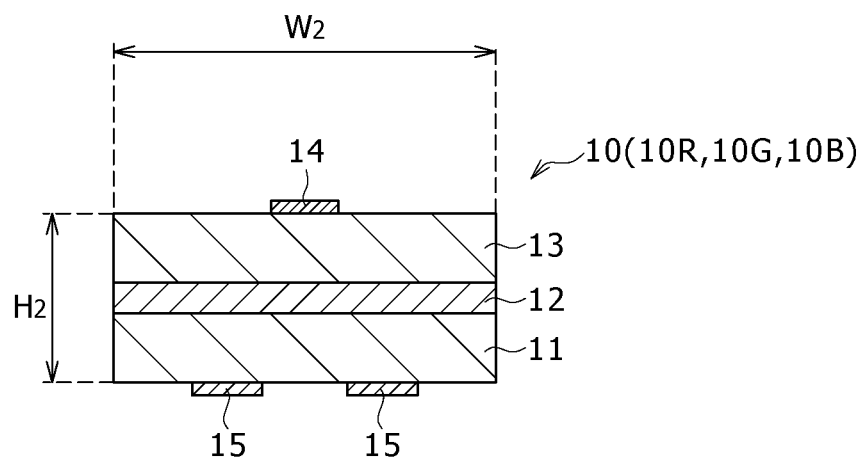
FIG. 2 is a cross sectional view showing an example of a structure of a light emitting element shown in FIGS. 1A and 1B.

Each of the light emitting elements 10, for example, as shown in FIG. 2, has a lamination structure in which a layer 11 of a first conductivity type, an active layer 12, and a layer 13 of a second conductivity type are laminated in order. In each of the light emitting elements 10G and 10B, each of the layer 11 of the first conductivity type, the active layer 12, and the layer 13 of the second conductivity type is made of an InGaN system semiconductor material. On the other hand, in the light emitting element 10R, each of the layer 11 of the first conductivity type, the active layer 12, and the layer 13 of the second conductivity type is made of an AlGaInP system semiconductor material. Each of a first electrode 14 and a second electrode 15, for example, is made so as to contain therein a metallic material such as silver (Ag) having a high reflective property. It is noted that although not illustrated, each of the light emitting elements 10 may have an insulating film covering an un-formed area of the first electrode 14 of the side surface and the upper surface.

Figure 3:
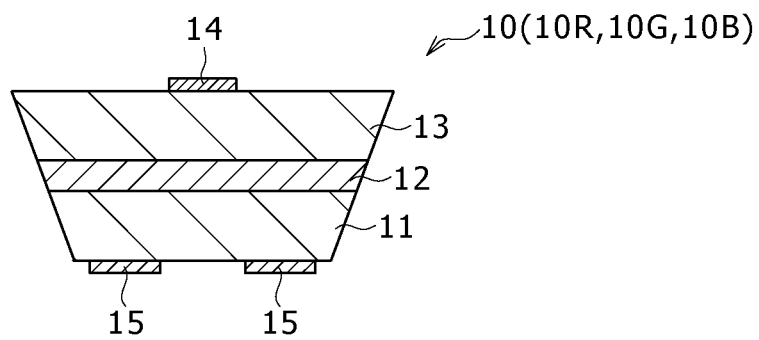
FIG. 3 is a cross sectional view showing another example of the structure of the light emitting element shown in FIGS. 1A and 1B.

The side surface of each of the light emitting elements 10, for example, as shown in FIG. 2, is a surface perpendicular to the lamination direction. It is noted that the side surface of each of the light emitting elements 10 may be an inclined surface intersecting with the lamination direction in consideration of a light taking-out efficiency. For example, as shown in FIG. 3, each of the light emitting elements 10 may have an inclined surface in a side surface thereof in such a way that the corresponding one of the light emitting elements 10 has an inverse trapezoid-like shape in cross section.

The first electrode 14 is provided on an upper surface of the layer 13 of the second conductivity type. The first electrode 14 contacts the layer 13 of the second conductivity type and is also electrically connected to the layer 13 of the second conductivity type. On the other hand, the second electrode 15 is provided on a lower surface of the layer 11 of the first conductivity type. The second electrode 15 contacts the layer 11 of the first conductivity type and is also electrically connected to the layer 11 of the first conductivity type. Each of the first electrode 14 and the second electrode 15 either may be composed of a single electrode or may be composed of plural electrodes. Note that, in the following description, it is supposed that as shown in FIG. 2 or FIG. 3, the first electrode 14 is composed of a single electrode, and the second electrode 15 is composed of two electrodes.

As shown in FIG. 1A, the light emitting device 1 further includes a chip-like insulator 20 covering each of the light emitting elements 10, and plural terminal electrodes 30 and 40 electrically connected to the light emitting elements 10.

(Insulator 20)

The insulator 20 surrounds the light emitting elements 10 at least from the side surface side of the light emitting elements 10, and holds the light emitting elements 10. The insulator 20, for example, is made of a resin material such as polyimide. The insulator 20 is formed so as to contact both of the side surfaces of the light emitting elements 10, and unformed areas of the first electrode 14 of the upper surfaces of the light emitting elements 10. The insulator 20 has a strip-like shape (such as a rectangular parallelepiped-like shape) extending in an arrangement direction of the light emitting elements 10. In this case, a height of the insulator 20 is higher than that of each of the light emitting elements 10, and a transverse width of the insulator 20 is wider than a width of each of the light emitting elements 10. The size of the insulator 20 itself, for example, is not greater than 1 mm. The insulator 20 has a thin section-like shape. The aspect ratio (maximum height/maximum transverse width) of the insulator 20 is reduced to such a degree that the light emitting device 1 does not lie down when the light emitting device 1 is transferred and, for example, is set ⅕ or less.

The insulator 20, for example, as shown in FIG. 1A, has openings 20A in portions corresponding to positions right above the light emitting elements 10, respectively. At least the first electrodes 14 are exposed from the bottom surfaces of the openings 20A, respectively. In addition, the insulator 20, for example, as shown in FIG. 1B, has openings 20B in portions corresponding to positions as well right below the light emitting elements 10, respectively. At least the two second electrodes 15 are exposed from each of bottom surfaces of the openings 20B. A connection portion 50 and a temporarily fixing portion 60 are provided inside each of the openings 20B. In this case, the two second electrodes 15 and a lower electrode 32 which will be described later are electrically connected to each other through the connection portion 50. Also, the temporarily fixing portion 60 contacts an area between at least the two second electrodes 15 of the lower surface of the layer 11 of the first conductivity type. The connection portion 50 corresponds to a concrete example of "a metallic portion" of the present disclosure. The connection portion 50, for example, is formed in plate processing. It is noted that the connection portion 50 may also be formed by utilizing a method other than the plate processing. The connection portion 50 has not only a role of electrically connecting the second electrode 15 and the lower electrode 32 to each other, but also a role of reflecting a light emitted from the active layer 12 to the side of the layer 13 of the second conductivity type. The temporarily fixing portion 60 is used to temporarily fix each of the light emitting elements 10 in the manufacturing processes and, for example, is obtained by solidifying a photo-sensitive resin.

For example, as shown in FIG. 1A, the insulator 20 further has six cutouts 20C in side portions facing each other. Each pair of two cutouts 20C is formed on respective two long sides of the insulator 20, and is formed in positions facing each other in a direction of a minor axis of the insulator 20, with corresponding one of the three light emitting elements 10 being positioned in the center of the pair. For example, the two cutouts 20C are respectively formed on the both sides of the light emitting element 10G, the two cutouts 20C are respectively formed on the both sides of the light emitting element 10R, and the two cutouts 20C are respectively formed on the both sides of the light emitting element 10B. The two cutouts 20C on the both sides of the light emitting element 10G are formed in one end portion of the two long sides of the insulator 20, and the two cutouts 20C on the both sides of the light emitting element 10B are formed in the other end portion of the two long sides of the insulator 20. Also, the two cutouts 20C on the both sides of the light emitting element 10R are formed in the vicinities of the central portions of the two long sides of the insulator 20. For example, as shown in FIG. 1A, each of the cutouts 20C has the rectangular parallelepiped-like shape. It is noted that each of the cutouts 20C may have any other suitable shape different from the rectangular parallelepiped-like shape.

(Terminal Electrodes 30 and 40)

Two terminal electrodes 30 and 40 are electrically connected to each of the three light emitting elements 10. One terminal electrode 30 is electrically connected to one of the second electrodes 15, and one terminal electrode 40 is electrically connected to one of the first electrodes 14. Each of the terminal electrodes 30 is formed in one long side of the insulator 20, and each of the terminal electrodes 40 is formed in the other long side of the insulator 20.

For example, as shown in FIGS. 1A and 1B, each of the terminal electrodes 30 is composed of an upper electrode 31 and a lower electrode 32. It is noted that the upper electrode 31 corresponds to a concrete example of "a first terminal electrode" of the present disclosure, and the lower electrode 32 corresponds to a concrete example of "a second terminal electrode" of the present disclosure. The upper electrode 31 has a shape extending along the cutout 20C. The upper electrode 31 extends along both of the upper surface and the side surface of the insulator 20, and is formed so as to protrude from a peripheral edge (specifically, the cutout 20C) of the insulator 20. The portion (the protrusion 31A) (refer to FIG. 1B), protruding from the peripheral edge (specifically, the cutout 20C) of the insulator 20, of the upper electrode 31 may project from the cutout 20C. However, preferably, the portion (the protrusion 31A) is fitted within the cutout 20C. On the other hand, the lower electrode 32 has a flat plate-like shape. The lower electrode 32 extends along the lower surface of the insulator 20, and is formed so as to protrude from the peripheral edge (specifically, the cutout 20C) of the insulator 20. The portion (the protrusion 32A), protruding from the peripheral edge (specifically, the cutout 20C) of the insulator 20, of the lower electrode 32 contacts the protrusion 31A of the upper electrode 31. Each of the protrusions 31A and 32A is provided in one long side of the two long sides of the insulator 20. The protrusion 31A is exposed from the upper surface side of the light emitting device 1, and the protrusion 32A is exposed from the lower surface side of the light emitting device 1. The lower electrode 32 is connected to the connection portion 50, and is electrically connected to the second electrode 15 through the connection portion 50. The lower electrode 32 has an opening 32B in a portion facing an area between at least two second electrodes 15 of the lower surface of the layer 11 of the first conductivity type. The opening 32B, for example, is filled with the temporarily fixing portion 60 described above.

For example, as shown in FIGS. 1A and 1B, each of the terminal electrodes 40 is composed of an upper electrode 41 and a lower electrode 42. It is noted that the upper electrode 41 corresponds to a concrete example of "the first terminal electrode" of the present disclosure, and the lower electrode 42 corresponds to a concrete example of "the second terminal electrode" of the present disclosure. The upper electrode 41 has a shape extending along the cutout 20C. The upper electrode 41 extends along both of the upper surface and the side surface of the insulator 20, and is formed so as to protrude from the peripheral edge (specifically, the cutout 20C) of the insulator 20. The portion (the protrusion 41A) (refer to FIG. 1B), protruding from the peripheral edge (specifically, the cutout 20C) of the insulator 20, of the upper electrode 41 may project from the cutout 20C. However, preferably, the portion (the protrusion 41A) is fitted within the cutout 20C. The protrusion 41A is disposed together with the protrusion 31A in the positions opposite to each other with respect to one light emitting element 10. The upper electrode 41 further has a connection portion (refer to FIG. 1A) extending from the upper surface of the insulator 20 to the inside of the opening 20A. Thus, the upper electrode 41 is electrically connected to the first electrode 14 through the connection portion 41B. On the other hand, the lower electrode 42 has a flat plate-like shape. The lower electrode 42 extends along the lower surface of the insulator 20, and is formed so as to protrude from the peripheral edge (specifically, the cutout 20C) of the insulator 20. The portion (the protrusion 42A), protruding from the peripheral edge (specifically, the cutout 20C) of the insulator 20, of the lower electrode 42 contacts the protrusion 41A of the upper electrode 41. Each of the protrusions 41A and 42 is provided in a long side, in which the protrusions 31A and 32A are not formed, of the two long sides of the insulator 20. The protrusion 41A is exposed from the upper surface side of the light emitting device 1, and the protrusion 42A is exposed from the lower surface side of the light emitting device 1. The lower electrode 42 composes together with the lower electrode 32 a flat bottom surface of the light emitting device 1.

Each of the terminal electrodes 30 and 40, for example, is made so as to mainly contain therein copper (Cu). A part of each of the surfaces of the terminal electrodes 30 and 40 may be covered with a material, such as gold (Au), which is hard to oxidize. For example, both of the surfaces of the protrusions 31A and 41A of the terminal electrodes 30 and 40, and surfaces of portions, contacting the side surface of the insulator 20, of the terminal electrodes 30 and 40 may be covered with the material, such as Au or Ti, which is hard to oxidize. In addition, for example, the entire surfaces of the terminal electrodes 30 and 40 may be covered with the material, such as Au or Ti, which is hard to oxidize. In addition, for example, the entire surfaces of the terminal electrodes 30 and 40 may be made of the same material. The aspect ratio (the height $H_1$/the width $W_1$) of the light emitting device 1 is set smaller than 1.

[Manufacturing Method]

Next, a description will be given with respect to an example of a method of manufacturing the light emitting device 1 according to the first embodiment of the present disclosure.

Figure 4A:
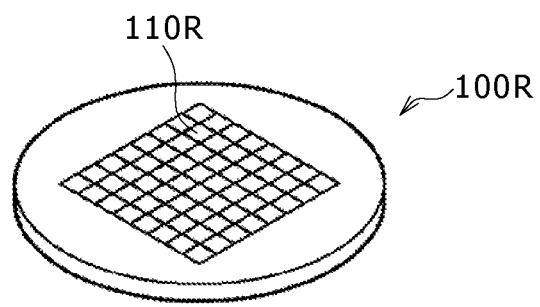
FIGS. 4A to 4C are respectively perspective views each showing an example of a wafer used when the light emitting device shown in FIGS. 1A and 1B is manufactured.
Figure 4B:
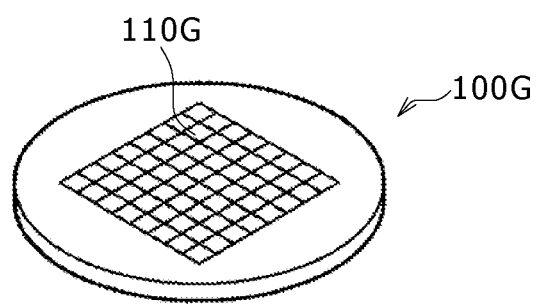
Figure 4C:
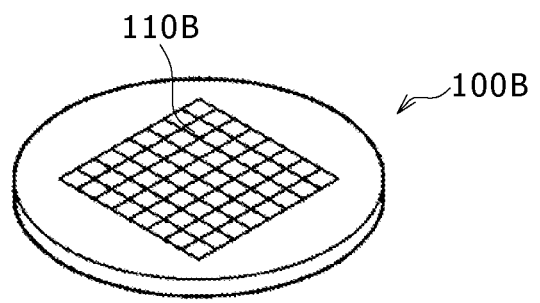

Firstly, a wafer 100R is prepared in which a large number of portions (the light emitting elements 110R) other than the second electrodes 15 of the light emitting elements 10R are formed on a substrate for crystal growth (refer to FIG. 4A). In addition, a wafer 100G is prepared in which a large number of portions (the light emitting elements 110G) other than the second electrodes 15 of the light emitting elements 10G are formed on a substrate for crystal growth (refer to FIG. 4B). Moreover, a wafer 100B is prepared in which a large number of portions (the light emitting elements 110B) other than the second electrodes 15 of the light emitting elements 10B are formed on a substrate for crystal growth (refer to FIG. 4C). It is noted that each of the light emitting elements 110R, 110G, and 110B has a structure in which the layer 11 of the first conductivity type, the active layer 12, the layer 13 of the second conductivity type, and the first electrode 14 are laminated in this order from the substrate for the crystal growth.

Figure 5A:
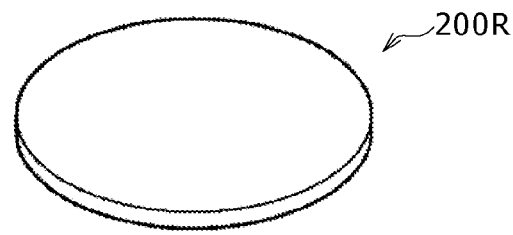
FIGS. 5A to 5C are respectively perspective views each showing an example of a temporarily fixing substrate used when the light emitting device shown in FIGS. 1A and 1B is manufactured.
Figure 5B:
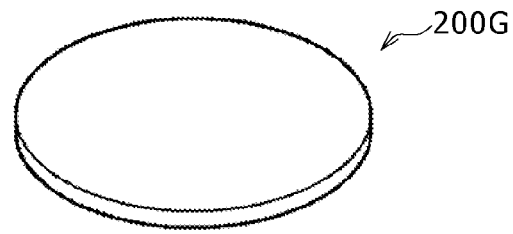
Figure 5C:
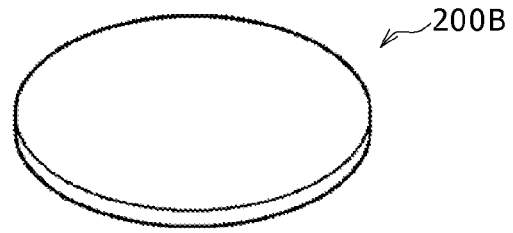

In addition, a temporarily fixing substrate 200R for temporarily fixing all of the light emitting elements 110R formed on the wafer 100R is prepared (refer to FIG. 5A). Likewise, there are prepared a temporarily fixing substrate 200G for temporarily fixing all of the light emitting elements 110G formed on the wafer 100G, and a temporarily fixing substrate 200B for temporarily fixing all of the light emitting elements 110B formed on the wafer 100B (refer to FIGS. 5B and 5C). Each of the temporarily fixing substrates 200R, 200G, and 200G, for example, is formed in such a way that an un-cured adhesive layer is disposed on a transparent substrate (such as a quartz substrate or a sapphire substrate).

Next, after the wafer 100R and the temporarily fixing substrate 200R are stuck to each other in such a way that each of the light emitting elements 110R formed on the wafer 100R comes in contact with the adhesive layer on the temporarily fixing substrate 200R, the adhesive layer is cured. Subsequently, the substrate of the wafer 100R is removed away by carrying out the lapping or the like to expose the layer 11 of the first conductivity type. After that, the second electrode 15 is formed on the layer 11 of the first conductivity type thus exposed. In such a way, plural light emitting elements 10R are formed on the temporarily fixing substrate 200R.

In addition, after the wafer 100G and the temporarily fixing substrate 200G are stuck to each other in such a way that each of the light emitting elements 110G formed on the wafer 100G comes in contact with the adhesive layer on the temporarily fixing substrate 200G, the adhesive layer is cured. Subsequently, the substrate of the wafer 100G is removed away by carrying out the laser radiation or the like to expose the layer 11 of the first conductivity type. After that, the second electrode 15 is formed on the layer 11 of the first conductivity type thus exposed. In such a way, plural light emitting elements 10G are formed on the temporarily fixing substrate 200G.

Likewise, after the wafer 100B and the temporarily fixing substrate 200B are stuck to each other in such a way that each of the light emitting elements 110B formed on the wafer 100B comes in contact with the adhesive layer on the temporarily fixing substrate 200B, the adhesive layer is cured. Subsequently, the substrate of the wafer 100B is removed away by carrying out the laser radiation or the like to expose the layer 11 of the first conductivity type. After that, the second electrode 15 is formed on the layer 11 of the first conductivity type thus exposed. In such a way, plural light emitting elements 10B are formed on the temporarily fixing substrate 200B.

Figure 6:
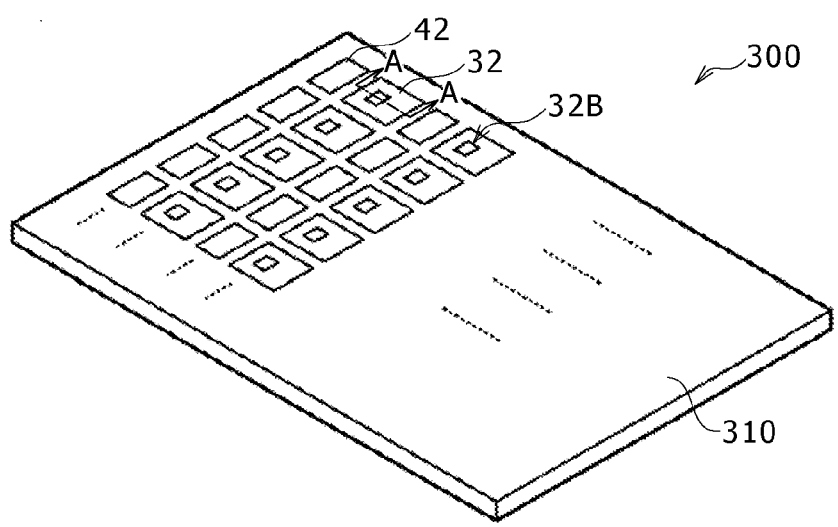
FIG. 6 is a perspective view showing an example of a wiring substrate used when the light emitting device shown in FIGS. 1A and 1B is manufactured.

Next, a wiring substrate 300 is prepared to which the light emitting elements 10R, 10G, and 10B are to be mounted (refer to FIG. 6). The wiring substrate 300, for example, is a substrate in which plural pairs of lower electrodes 32 and lower electrodes 42 are disposed on a transparent substrate 310 (such as a quartz substrate). Subsequently, the light emitting elements 10R, 10G, and 10B are mounted on the lower electrodes 32 of the wiring substrate 300, respectively.

Figure 7A:
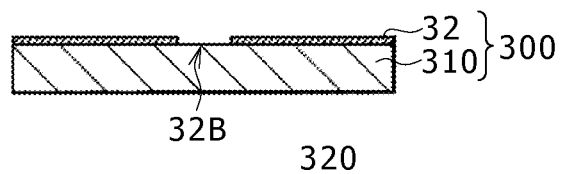
FIGS. 7A to 7G are cross sectional views showing an example of a method of obtaining electrical connection between the light emitting element shown in FIGS. 1A and 1B and the wiring substrate shown in FIG. 6.

FIG. 7A shows a cross-sectional structure when viewed from a direction indicated by a line A-A of FIG. 6. FIGS. 7B to 7G schematically show a procedure for mounting the light emitting element 10G on the lower electrode 32 of the wiring substrate 300. It is noted that a method of mounting the light emitting element 10R, 10B on the lower electrode 32 of the wiring substrate 300 is the same as that of mounting the light emitting element 10G on the lower electrode 32 of the wiring substrate 300.

Figure 7B:
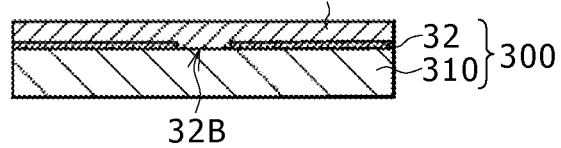

Firstly, a photo-sensitive resin 320, for example, is formed on the surface of the wiring substrate 300 so as to have a thickness of about 1.5 µm (refer to FIG. 7B). The photo-sensitive resin 320 is composed of a plastic resin which is cured by an external factor such as heating or light radiation and, for example, is composed of a thermosetting photo-sensitive resin. When the photo-sensitive resin 320 is composed of the thermosetting photo-sensitive resin, the photo-sensitive resin 320 is formed by sticking a sheet-like resin. Or, for example, a resin is applied by utilizing a spin-coating method, and a solvent is then volatized by carrying out the pre-baking, thereby forming the photo-sensitive resin 320.

Next, only a portion, corresponding to the circumference of the opening 32B, of the photo-sensitive resin 320 is exposed to form a photo-curable area 320A. The photo-curable area 320A is provided in order to maintain a fillet 320B which will be described later, and thus either may be formed so as to perfectly surround the opening 32B, or may be intermittently formed in the circumference of the opening 32B. It is noted that the partial exposure at this time can also be carried out by utilizing an ion beam method or the like in addition to a normal method using a mask.

Figure 7C:
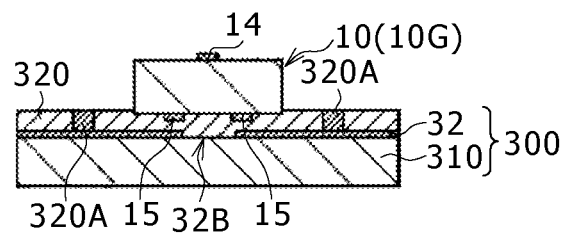
Figure 7D:
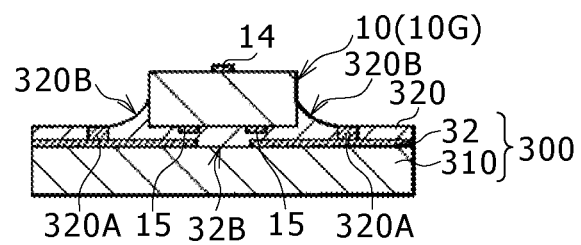
Figure 8:
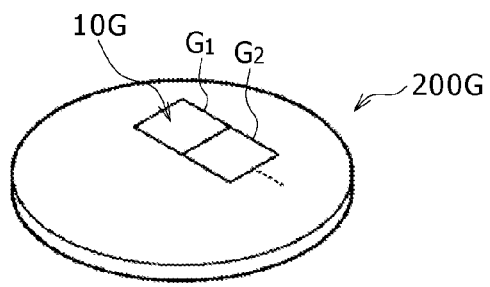
FIGS. 8 and 9 are perspective views showing the method shown in FIGS. 7A to 7G.

Next, the light emitting elements 10G formed on the temporarily fixing substrate 200G are transferred onto the surface of the wiring substrate 300 (refer to FIG. 7C). Specifically, after the temporarily fixing substrate 200G and the wiring substrate 300 are stuck to each other in such a way that the light emitting elements 10G formed on the temporarily fixing substrate 200G come in contact with the photo-sensitive resin layer 320, the light emitting elements 10G are peeled off from the temporarily fixing substrate 200G by carrying out the laser radiation. At this time, the laser beam is not simultaneously radiated to all of the light emitting elements 10G formed on the temporarily fixing substrate 200G, but the laser beam is radiated to a part of the light emitting elements 10G formed on the temporarily fixing substrate 200G. Briefly speaking, the thinning-out transfer is carried out. For example, as shown in FIG. 8, all of the light emitting elements 10G formed on the temporarily fixing substrate 200G are divided into plural blocks Gi (i: positive integer number), and the light emitting elements 10G are peeled off one by one every block Gi by carrying out the laser radiation. In such a way, the light emitting elements 10G are transferred at a wide pitch onto the photo-sensitive resin layer 320. At this time, the light emitting element 10G is disposed right above the lower electrode 32 in a predetermined position of the photo-sensitive resin layer 320. The light emitting element 10G may be roughly aligned with the lower electrode 32.

Next, in a state in which the light emitting elements 10G are placed on the photo-sensitive resin layer 320, the entire wiring substrate 300, for example, is heated at 50° C. for about 30 minutes. The heating temperature and time are determined in suitable ranges, respectively, depending on the resin characteristics of the photo-sensitive resin layer 320. Since the heating of the entire wiring substrate 300 reduces the viscosity of the photo-sensitive resin layer 320, the photo-sensitive resin layer 320 drags itself onto a sidewall of the light emitting element 10G to form the fillet 320B (refer to FIG. 7D). At this time, since each of the molecules of the resin thus heated intends to settle down to the lowest energy level thereof, the fillet 320B operates to push down the light emitting element 10G toward the transparent substrate 310. In addition, at this time, a thermoset area 320A suppresses that the molecules of the resin thus heated escapes to the outside. As a result, the second electrodes 15 of the light emitting element 10G come close to the lower electrode 32.

The operation of such a force results in that a gap defined between each of the two second electrodes 15 and the lower electrode 32 in the light emitting element 10G is reduced, and a dispersion of the gap for each light emitting element 10G is also reduced. It is noted that the gap described above does not perfectly become zero. The self-align of the light emitting element 10G with the lower electrode 32 can be realized in the manner described above.

Figure 7E:
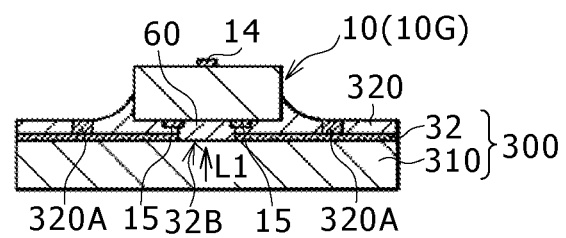

Next, a light $L_1$ is radiated from the back surface of the transparent substrate 310 to the photo-sensitive resin layer 320 to expose the photo-sensitive resin layer 320 (refer to FIG. 7E). At this time, the lower electrode 32 functions as a self-align mask, and thus a portion, facing to the opening 32B of the lower electrode 32, of the photo-sensitive resin layer 320 is cured. The portion thus cured becomes the temporarily fixing portion 60 for temporarily fixing the light emitting element 10G to the wiring substrate 300.

Figure 7F:
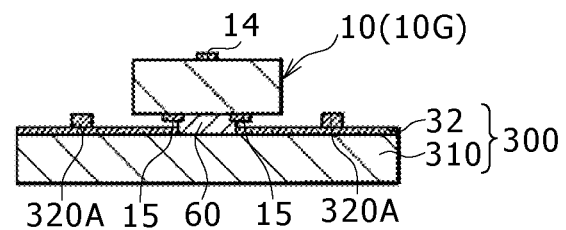

Next, an un-exposed portion of the photo-sensitive resin layer 320 is removed away by carrying out the development (refer to FIG. 7F). At this time, since in the gap defined between each of the second electrodes 15, and the lower electrode 32, the photo-sensitive resin layer 320 is not exposed because the photo-sensitive resin layer 320 is hidden behind the lower electrode 32, the photo-sensitive resin layer 320 is dissolved in a developing solution. Therefore, carrying out the development results in that the gap defined between each of the two second electrodes 15, and the lower electrode 32 becomes an air gap.

Figure 7G:
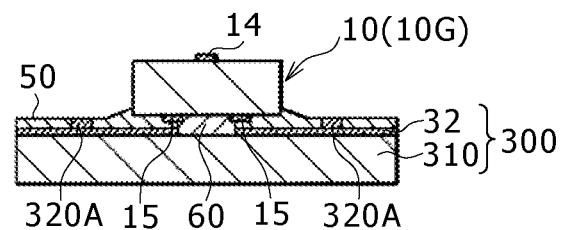
Figure 9:
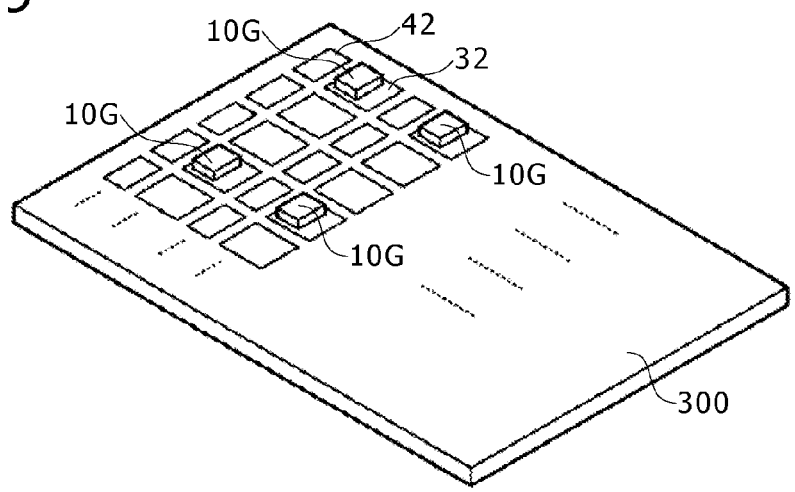
Figure 10:
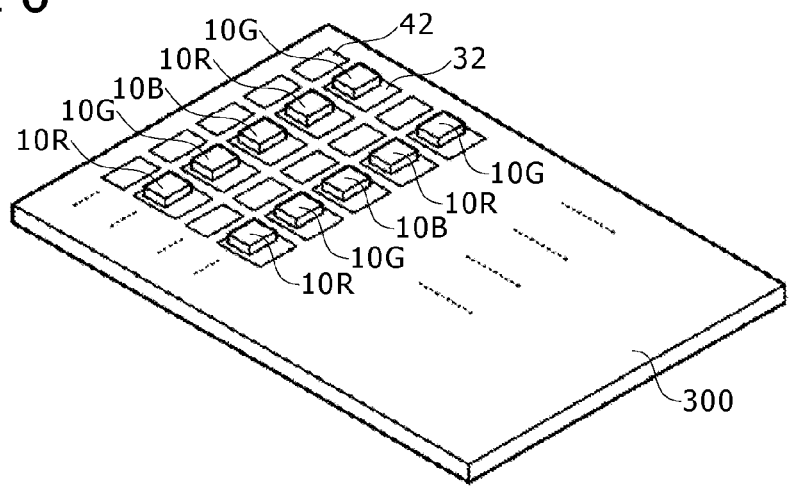
FIGS. 10 and 11 are perspective views showing the subsequent process of the method shown in FIGS. 7A to 7G.

Next, electrolytic plating is carried out. In the electrolytic plating, a voltage of, for example, a voltage of about 0.5 to about 1.0 V is applied across the lower electrode 32 becoming a cathode, and an electrolysis solution to cause a current of about 10 mA/cm² to flow through an anode plate and the electrolytic plating solution. As a result, plating growth is started, and as shown in FIG. 7G, finally, the connection portion 50, for example, made of an electrolytic plating material having a thickness of about 0.5 µm. As a result, each of the two second electrodes 15, and the lower electrode 32 are electrically and mechanically tightly connected to each other through the connection portion 50. In such a way, the light emitting element 10G formed on the temporarily fixing substrate 200G is transferred onto the surface of the wiring substrate 300 (refer to FIG. 9). In addition, by utilizing the same method, the light emitting elements 10R formed on the temporarily fixing substrate 200R, and the light emitting elements 10B formed on the temporarily fixing substrate 200B are both transferred onto the surface of the wiring substrate 300 (refer to FIG. 10).

After that, the insulating layer 20, and the terminal electrodes 30 and 40 are formed. As a result, plural light emitting devices 1 are formed on the wiring substrate 300 (refer to FIG. 11).

[Mounting Method]

Next, a description will be given with respect to an example of a method of mounting each of the light emitting devices 1 formed on the wiring substrate 300 onto a wiring substrate included in a display panel, an illumination panel or the like.

Figure 12A:
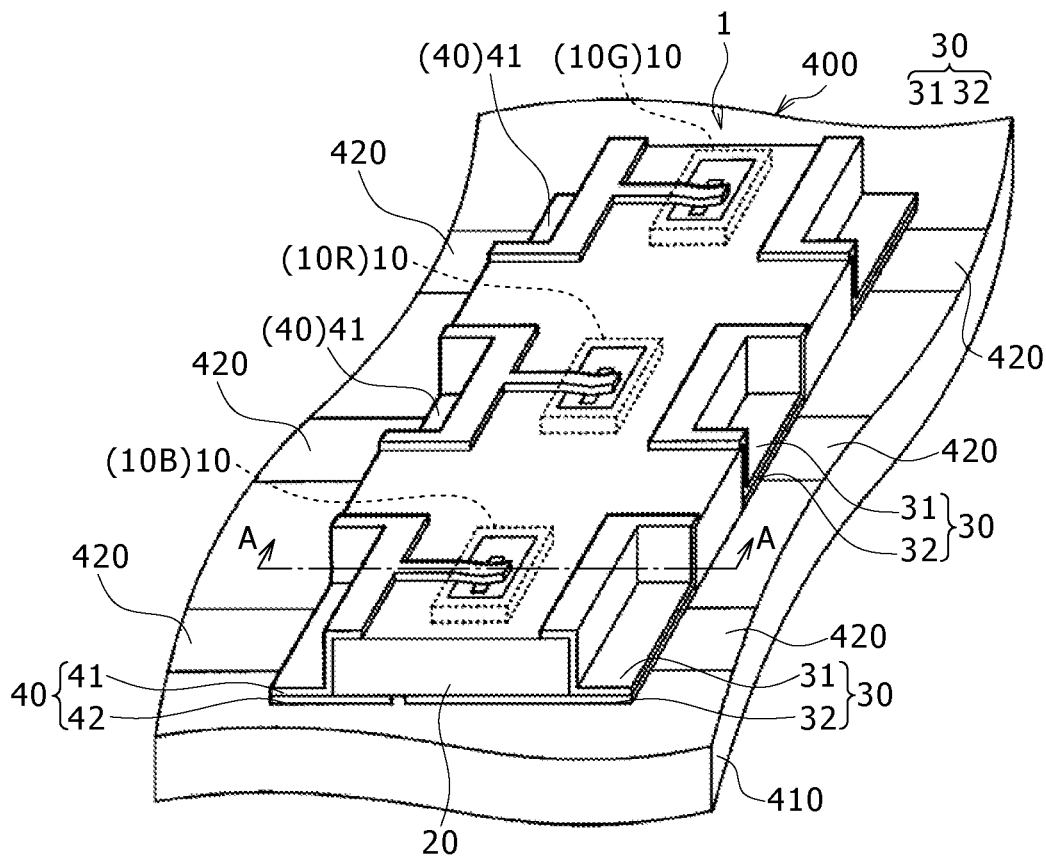
FIGS. 12A and 12B are respectively a perspective view showing an example of a method of mounting the light emitting device shown in FIGS. 1A and 1B formed on the wiring substrate shown in FIG. 6 onto another wiring substrate, and a cross sectional view taken on line A-A of FIG. 12A.

Firstly, a temporarily fixing substrate (not shown) for temporarily fixing all of the light emitting devices 1 formed on the wiring substrate 300 is prepared. The temporarily fixing substrate used in this case, for example, is formed in such a way that an un-cured adhesive layer is disposed on a transparent substrate (such as a quartz substrate). In addition, a wiring substrate 400 is prepared which is used for the mounting of the light emitting device 1. The wiring substrate 400 is a substrate in which plural electrode pads 420 and the like are included on a supporting substrate 410 (refer to FIG. 12A).

Figure 12B:
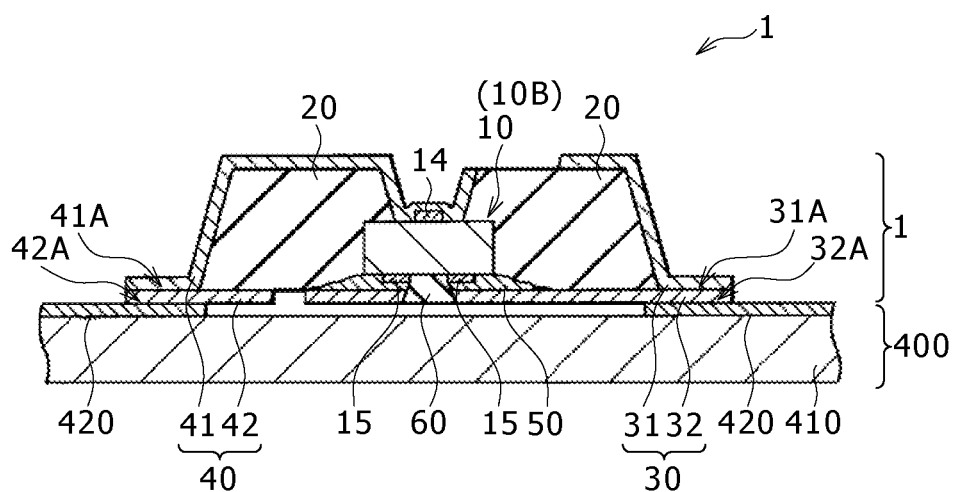

Next, after the wiring substrate 300 and the temporarily fixing substrate are stuck to each other in such a way that each of the light emitting devices 1 formed on the wiring substrate 300 comes in contact with the adhesive layer on the temporarily fixing substrate, the adhesive layer is cured. Subsequently, the transparent substrate 310 is removed away, and isolation between each adjacent two light emitting devices 1 is then carried out. Next, the individual light emitting devices 1 for which the isolation is carried out are mounted onto the wiring substrate 400. Specifically, after the temporarily fixing substrate and the wiring substrate 400 are stuck to each other in such a way that the individual light emitting light emitting devices 1 for which the isolation is carried out come in contact with the wiring substrate 400, the individual light emitting devices 1 are peeled off from the temporarily fixing substrate. As a result, the light emitting device 1 is placed on the electrode pads 420 (refer to FIGS. 12A and 12B).

Figure 13A:
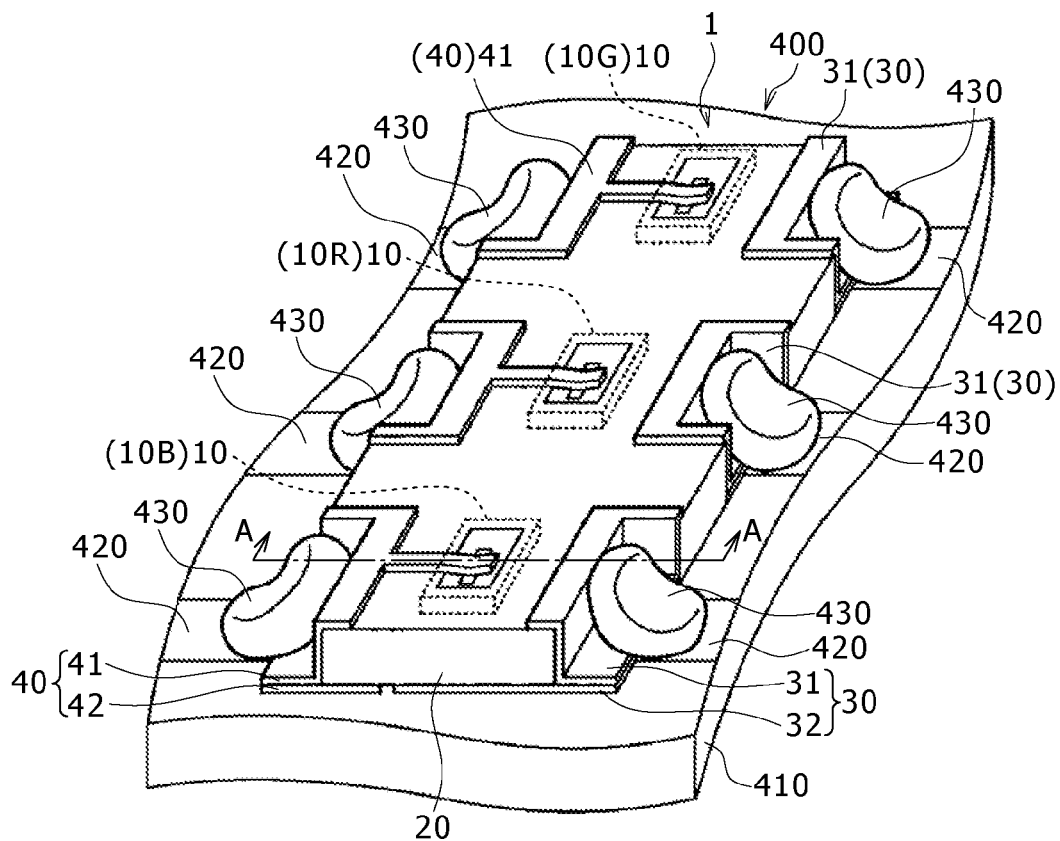
FIGS. 13A and 13B are respectively a perspective view showing the subsequent process of the method shown in FIG. 12, and a cross sectional view taken on line A-A of FIG. 13A.
Figure 13B:
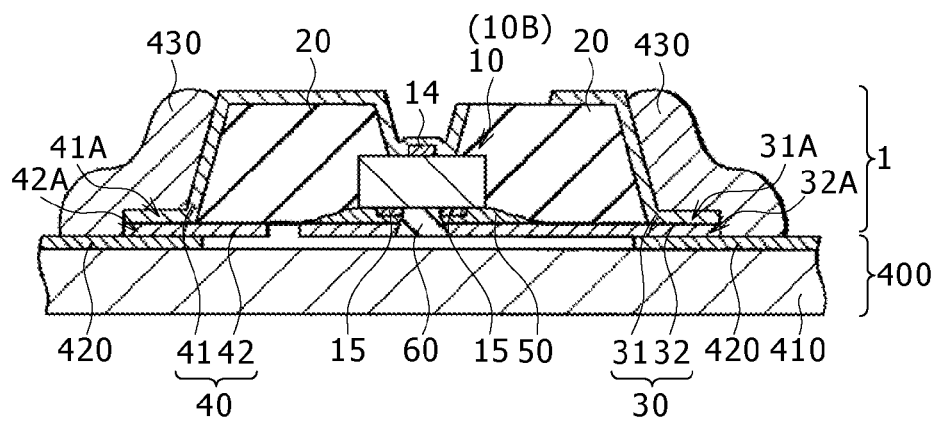

Next, a wiring layer 430 is formed so as to come in contact with surfaces of the protrusions 31A and 41A of the terminal electrodes 30 and 40, and surfaces of the electrode pads 420 (refer to FIGS. 13A and 13B). In such a way, the light emitting device 1 is mounted onto the wiring substrate 400.

[Effects]

Next, a description will be given with respect to the effects of the light emitting device 1 of the first embodiment.

Figure 14A:
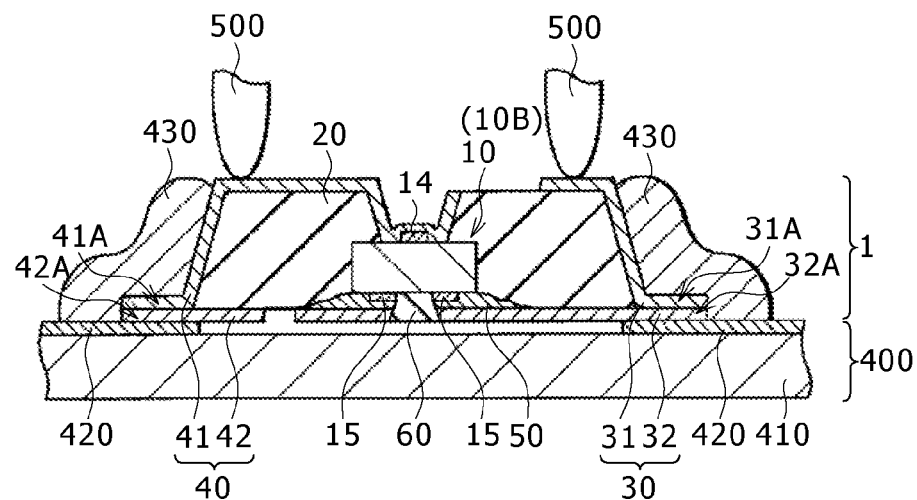
FIGS. 14A to 14C are respectively schematic cross sectional views showing an example of a situation of measuring characteristics of the light emitting device shown in FIGS. 1A and 1B.

In the light emitting device 1 of the first embodiment, the protrusions 31A and 32A, and 41A and 42A each protruding from the peripheral edge of the insulator 20 are provided in the terminal electrodes 30 and 40, respectively, which are electrically connected to the electrodes (such as the first electrode 14 and the two second electrodes 15) of the light emitting element 10. For this reason, each of the terminal electrodes 30 and 40 is exposed to any side of the upper surface side and the lower surface side of the light emitting device 1. Thus, when the light emitting device 1 is mounted onto the substrate, the protrusions 31A and 32A, and 41A and 42A can be used for the electrical connection between the light emitting device 1 and the substrate (refer to FIGS. 13A and 13B). As a result, since the light emitting device 1 can be mounted onto the substrate without using any of the wires, it is unnecessary to cause the cantilevers to come in contact with the terminal electrodes 30 and 40 of the light emitting device 1 while the wires are avoided. For example, as shown in FIG. 14A, the cantilevers 500 are merely caused to come in contact with the portions, which are not covered with a wiring layer 430, of the upper electrodes 31 and 41, respectively, thereby making it possible to measure the characteristics of the individual light emitting elements 10 after completion of the mounting. Therefore, it is possible to readily measure characteristics of the individual light emitting elements 10 after completion of the mounting.

In addition, when as described above, the cantilevers 500 are caused to come in contact with the portions, which are not covered with the wiring layer 430, of the upper electrodes 31 and 41, respectively, thereby measuring the characteristics of the individual light emitting elements 10 after completion of the mounting, there is not the possibility that the wiring layer 430 is damaged or peeled off by the cantilevers 500. Therefore, there is not the possibility that the measurement of the characteristics of the light emitting element 10 reduces the yield.

Figure 11:
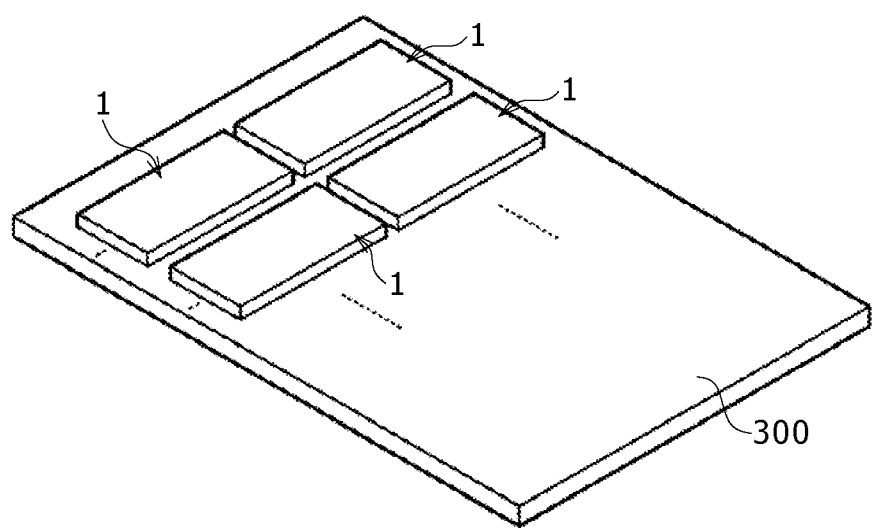
Figure 14B:
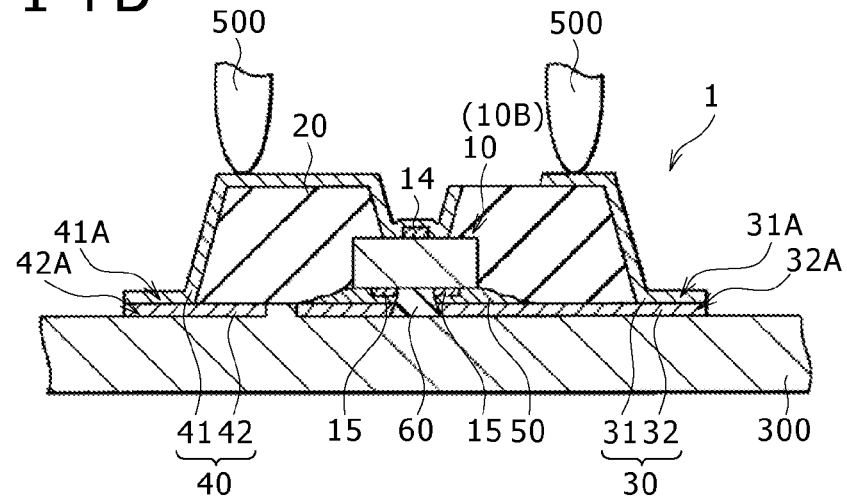
Figure 14C:
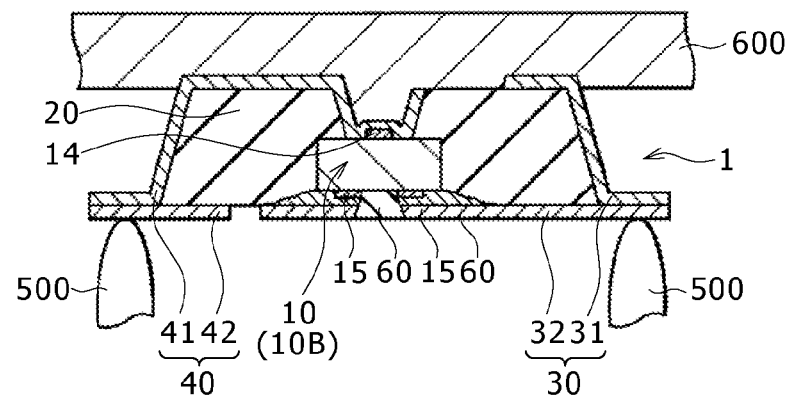

In addition, in the light emitting device 1 of the first embodiment, each of the terminal electrodes 30 and 40 is exposed to any side of the upper surface side and the lower surface side of the light emitting device 1. Thus, the cantilevers can be caused to come in contact with the terminal electrodes 30 and 40 of the light emitting device 1, respectively, from any side of the upper surface side and the lower surface side of the light emitting device 1. As a result, for example, even when one electrode (such as the first electrode 14 or each of the two second electrodes 15) of the light emitting element 10 is formed on each of the upper surface and the lower surface of the light emitting element 10, the cantilevers can be caused to come in contact with the protrusions 31A and 32A, and 41A and 42A of the terminal electrodes 30 and 40, respectively, which are electrically connected to the electrodes of the light emitting element 10, either from the upper surface side of the light emitting device 1, or from the lower surface side of the light emitting device 1. For example, as shown in FIG. 11, in the case where the state is obtained in which the light emitting devices 1 are formed on the wiring substrate 300, as shown in FIG. 14B, the cantilevers 500 are merely caused to come in contact with the upper electrodes 31 and 41, respectively, thereby making it possible to measure the characteristics of the individual light emitting elements 10 before completion of the wiring. In addition, as shown in FIG. 14C, when the light emitting devices 1 for which the isolation is carried out are fixed to a temporarily fixing substrate 600, the cantilevers 500 are merely caused to come in contact with the lower electrodes 32 and 42, respectively, thereby making it possible to measure the characteristics of the individual light emitting elements 10 before completion of the wiring. Therefore, it is possible to readily measure the characteristics of the individual light emitting elements 10 before completion of the wiring. As has been described, in the light emitting device 1 of the first embodiment, the characteristics of the individual light emitting elements 10 can be simply measured irrespective of before the mounting and after the mounting.

In addition, in the light emitting device 1 of the first embodiment, the protrusions 41A and 42A of the terminal electrode 40 which is electrically connected to the first electrode 14 are disposed in one long side of the insulator 20. Also, the protrusions 31A and 32A of the terminal electrode 30 which is electrically connected to the second electrode 15 are disposed in the other long side, in which the protrusion 41A and the protrusion 42A are not formed, of the two long sides of the insulator 20. As a result, it is possible to prevent both of the short-circuit between the terminal electrode 30 and the terminal electrode 40, and the reduction of the element withstand voltage. In addition, in the light emitting device 1 of the first embodiment, since the protrusions 31A and 32A, and 41A and 42A are disposed in such positions as to become symmetrical in relation to the light emitting element 10, it is also possible to prevent the disturbance of a Far Field Pattern (FFT) of the light emitting element 10.

<2. Changes>

(First Change)

Figure 15A:
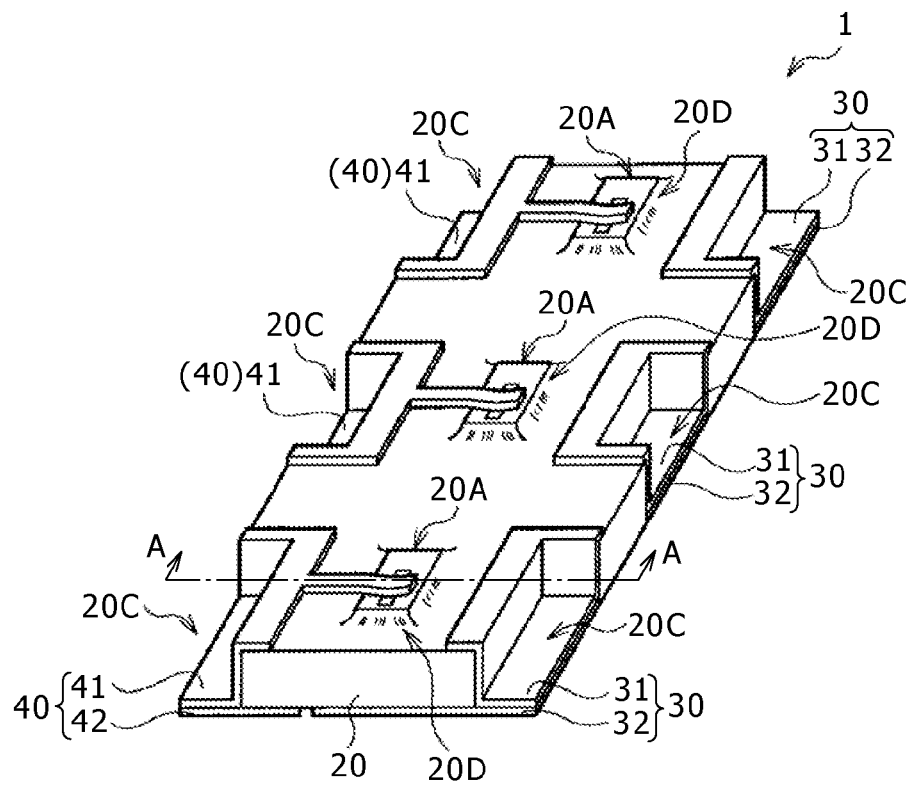
FIGS. 15A and 15B are respectively a perspective view showing a first change of the structure of the light emitting device shown in FIGS. 1A and 1B, and a cross sectional view taken on line A-A of FIG. 15A.
Figure 15B:
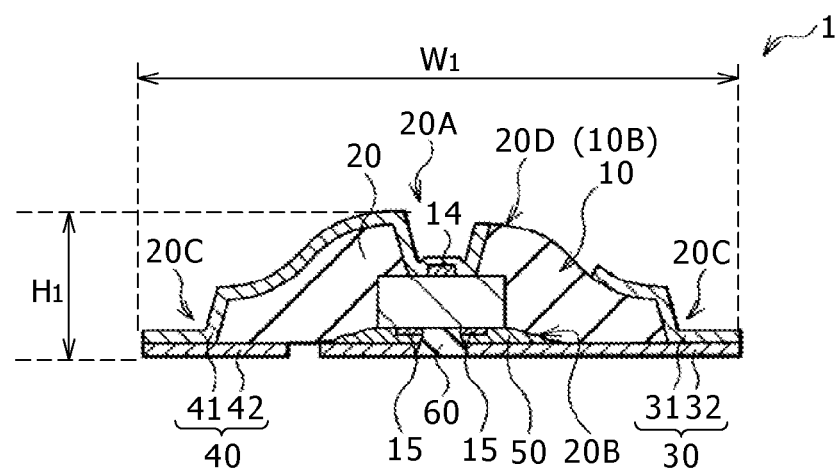

In the light emitting device 1 of the first embodiment, the upper surface of the insulator 20 is approximately flat. For example, however, as shown in FIGS. 15A and 15B, the insulator 20 may have an inclined surface 20D which is inclined in a negative direction from a portion facing the upper surface of each of the light emitting element 10 toward the peripheral edge of each of the light emitting element 10. When this structure is adopted, since the light emitted in an oblique direction from the light emitting element 10 becomes easy to refract and transmit in the inclined surface 20D, the light taking-out efficiency is enhanced.

Now, in order to provide the inclined surface 20D in the upper surface of the insulator 20, preferably, the gap defined between the adjacent two light emitting elements 10 is equal to or larger than the size of each of the light emitting elements 10. In addition, preferably, an interval between the light emitting element 10 and the side surface of the light emitting device 1 is ½ or more of the size of each of the light emitting elements 10.

(Second Change)

Figure 16:
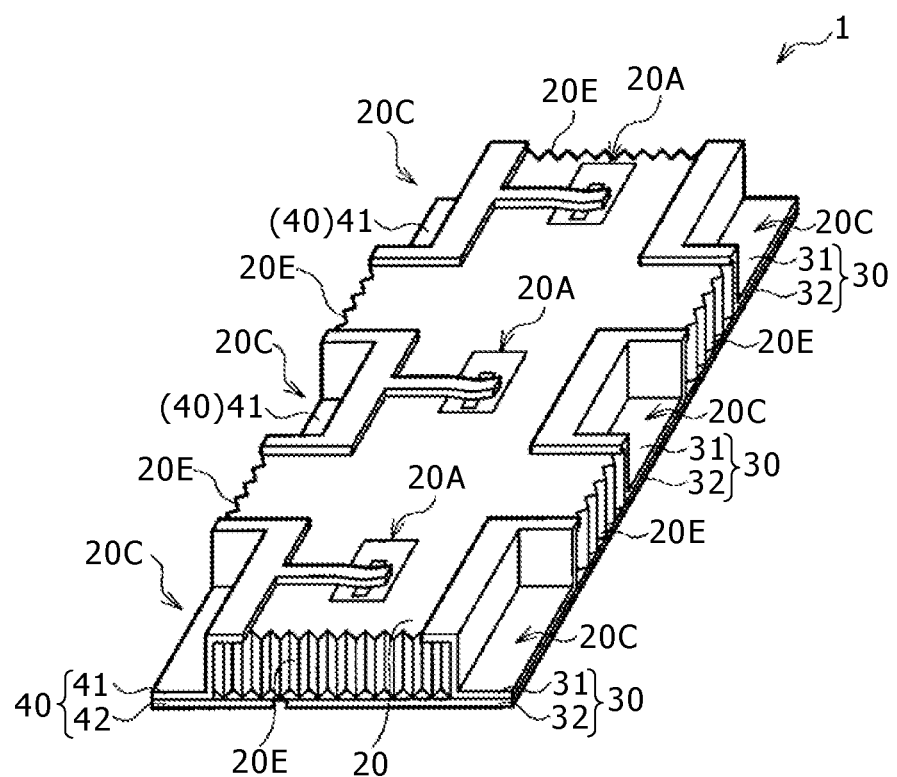
FIG. 16 is a perspective view showing a second change of the structure of the light emitting device shown in FIGS. 1A and 1B.

In addition, in the light emitting device of the first embodiment, and the light emitting device of the first change of the first embodiment, the side surface of the insulator 20 is approximately flat. For example, however, as shown in FIG. 16, the side surface of the insulator 20 may also be a concave-convex surface 20E. The concave-convex surface 20E, for example, as shown in FIG. 16, either may have a shape such that plural strip-like convex portions each extending in a longitudinal direction are disposed in parallel with one another, or may have a shape different from this shape. When such a structure is adopted, since the light emitted in an oblique direction from the light emitting element 10 becomes easy to refract and transmit in the concave-convex surface 20E, the light taking-out efficiency is enhanced.

(Third Change)

Figure 17:
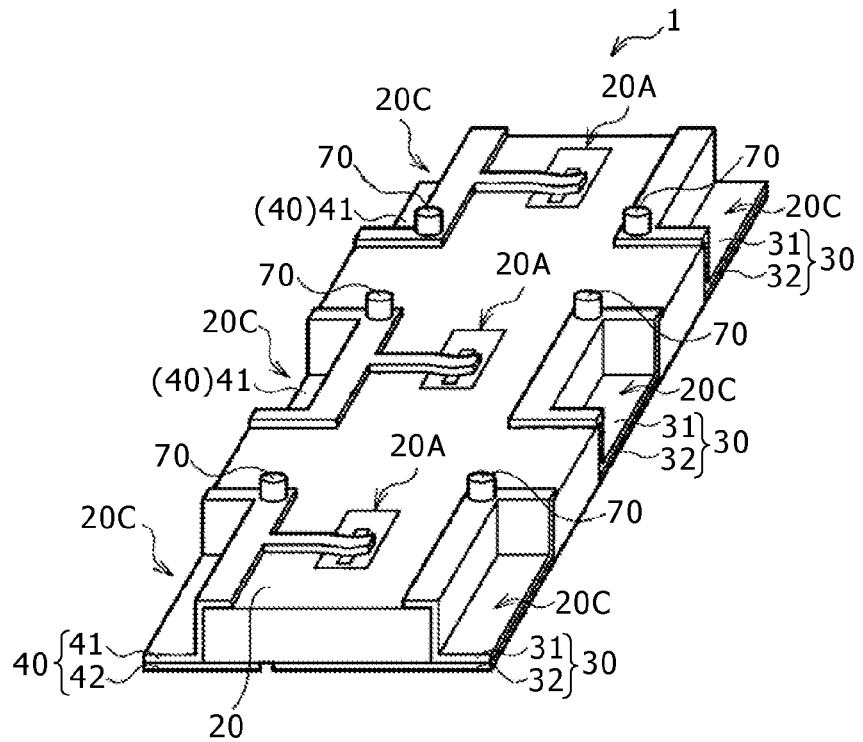
FIGS. 17 and 18 are respectively perspective views showing first and second forms of a third change of the structure of the light emitting device shown in FIGS. 1A and 1B.
Figure 18:
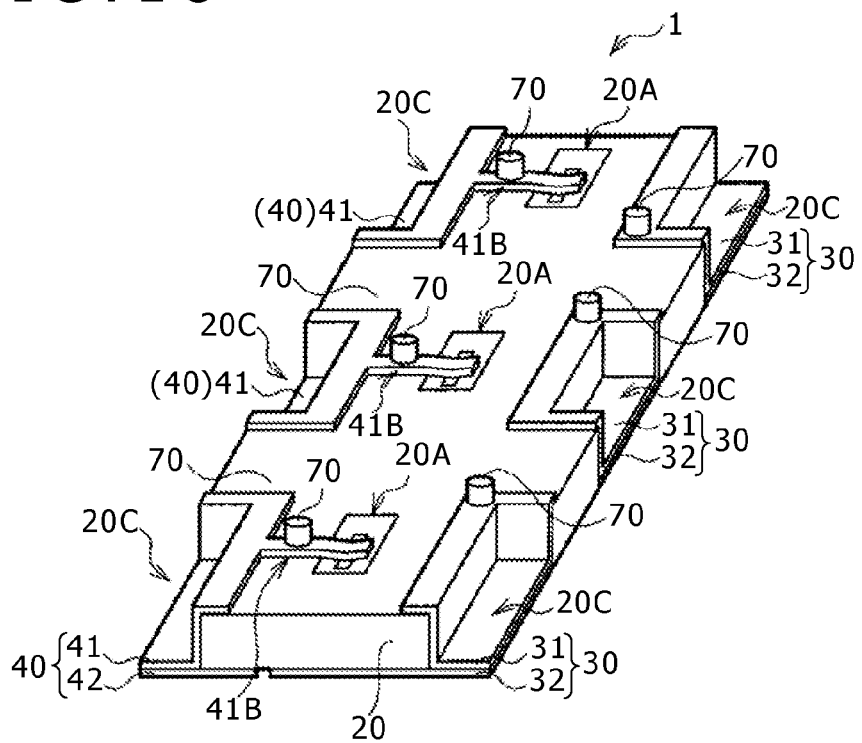

In the first embodiment, and the first and second changes thereof, for example, as shown in FIG. 17, one bump 70 may also be provided as a point with which the cantilevers are caused to come in contact in a phase of the measurement of the characteristics of the light emitting element 10 on each of the upper surfaces of the terminal electrodes 30 and 40. One bump 70, for example, is made of a metal such as gold (Au), and is electrically connected to each of the terminal electrodes 30 and 40. When such a structure is adopted, there is not the possibility that the wiring layer 430, and the terminal electrodes 30 and 40 are damaged by the cantilevers, and there is also not the possibility that the yield is reduced due to the measurement of the characteristics of the light emitting element 10. It is noted that the bump 70, for example, as shown in FIG. 18, may be provided on the connection portion 41B of the terminal electrode 40.

(Fourth Change)

Figure 19:
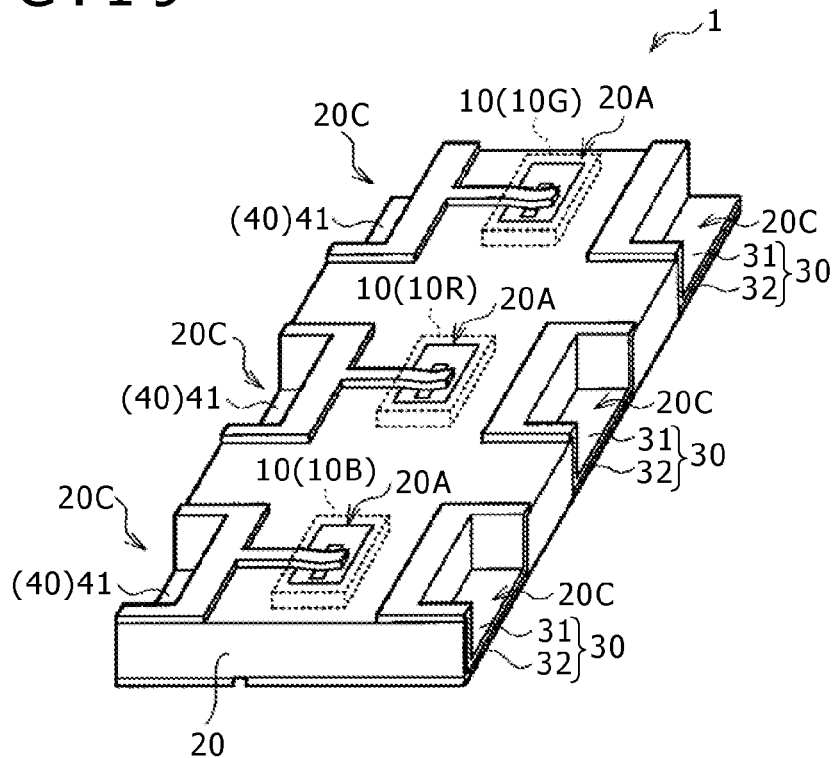
FIGS. 19 and 20 are respectively perspective views showing first and second forms of a fourth change of the structure of the light emitting device shown in FIGS. 1A and 1B.
Figure 20:
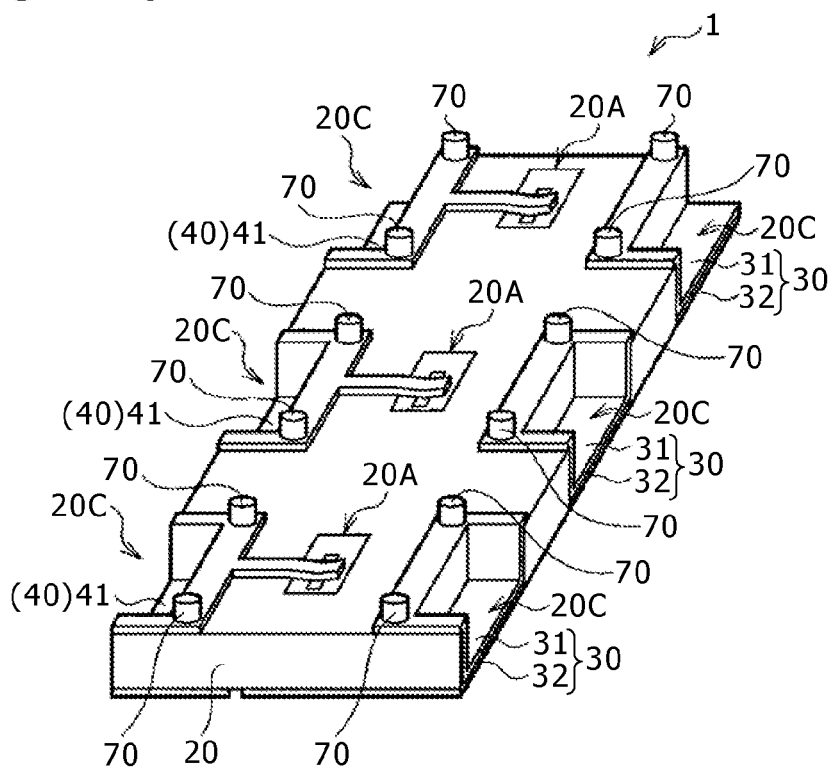

In the first embodiment, and the first to third changes thereof, the two cutouts 20C on the both sides of the light emitting element 10G, and the two cutouts 20C on the both sides of the light emitting element 10B are provided in the four corners of the insulator 20, respectively. For example, however, as shown in FIG. 19, the two cutouts 20C on the both sides of the light emitting element 10G, and the two cutouts 20C on the both sides of the light emitting element 10B may also be provided in places located at some distance from the four corners of the insulator 20, respectively. In addition, in this case, for example, as shown in FIG. 20, two bumps 70 may also be provided on each of the upper surfaces of the terminal electrodes 30 and 40.

(Fifth Change)

Figure 21:
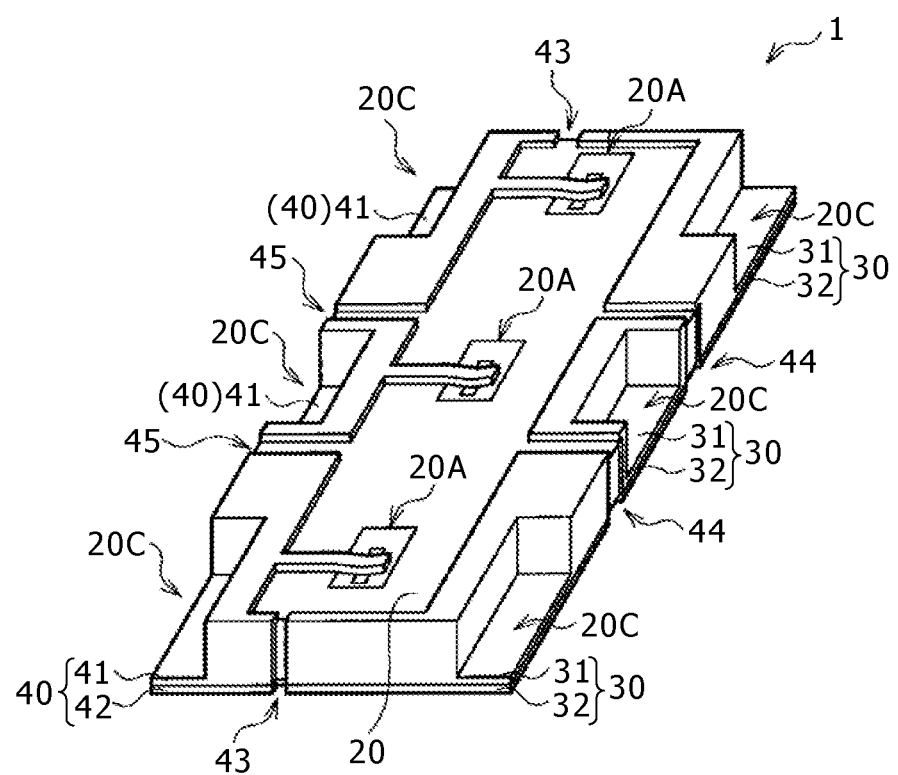
FIG. 21 is a perspective view showing a fifth change of the structure of the light emitting device shown in FIGS. 1A and 1B.

In addition, in the first embodiment, and the first to fourth changes thereof, the upper electrodes 31 and 41 cover only parts of the side surfaces of the insulator 20, respectively. For example, however, as shown in FIG. 21, the upper electrodes 31 and 41 may also cover almost all the side surfaces of the insulator 20, respectively. At this time, the side surfaces of the insulator 20 are exposed only from a gap 43 for separately insulating the upper electrode 31 and the upper electrode 41 from each other, a gap 44 for separately insulating the upper electrodes 31 from each other, and a gap 45 for separately insulating the upper electrodes 41 from each other. When such a structure is adopted, the light emitted in an oblique direction from the light emitting element 10 is reflected by the upper electrodes 31 and 41, and is finally emitted from the upper surface of the insulator 20. As a result, a front surface luminance is enhanced.

(Sixth Change)

Figure 22:
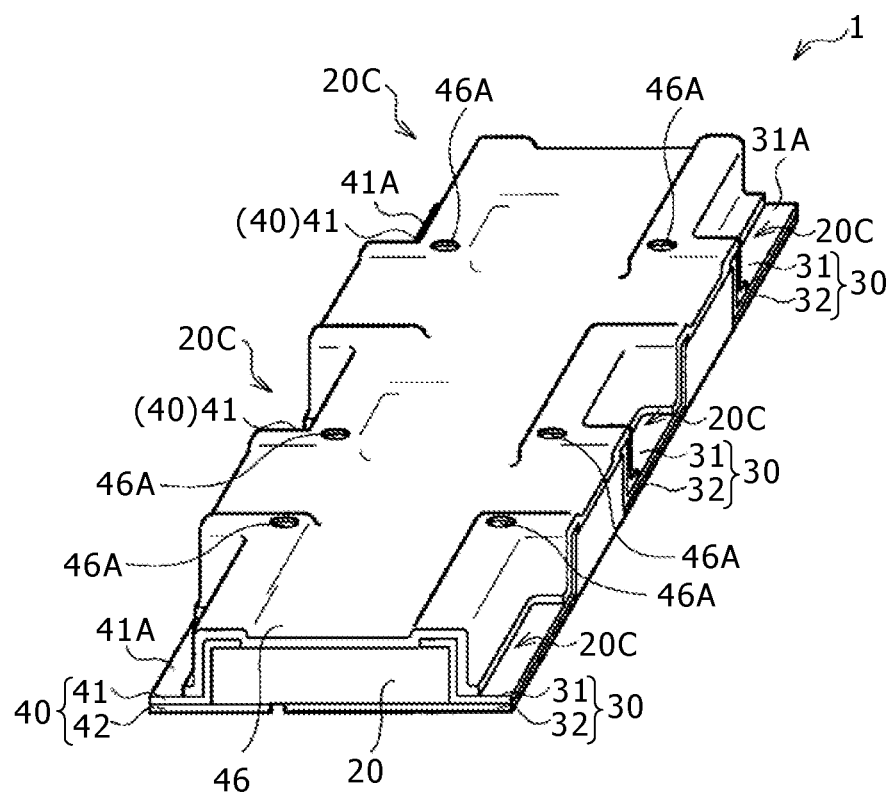
FIG. 22 is a perspective view showing a sixth change of the structure of the light emitting device shown in FIGS. 1A and 1B.

In addition, in the first embodiment, and the first to fifth changes thereof, the insulator 20, and the upper electrodes 31 and 41 are directly exposed from the upper surface of the light emitting element 10. For example, however, as shown in FIG. 22, a protective film 46 may also be provided which covers the entire upper surface of the light emitting element 10. The protective film 46 is made of an insulating material. The protective film 46, for example, as shown in FIG. 22, has openings 46A for cantilever contact in parts of portions facing the upper electrodes 31 and 41, respectively. In addition, the protective film 46 has openings (or cutouts) in portions as well, facing the portions (specifically, the protrusions 31A and 41A) used for connection with the wiring layer 430, of the upper electrodes 31 and 41, respectively.

(Seventh Change)

Figure 23A:
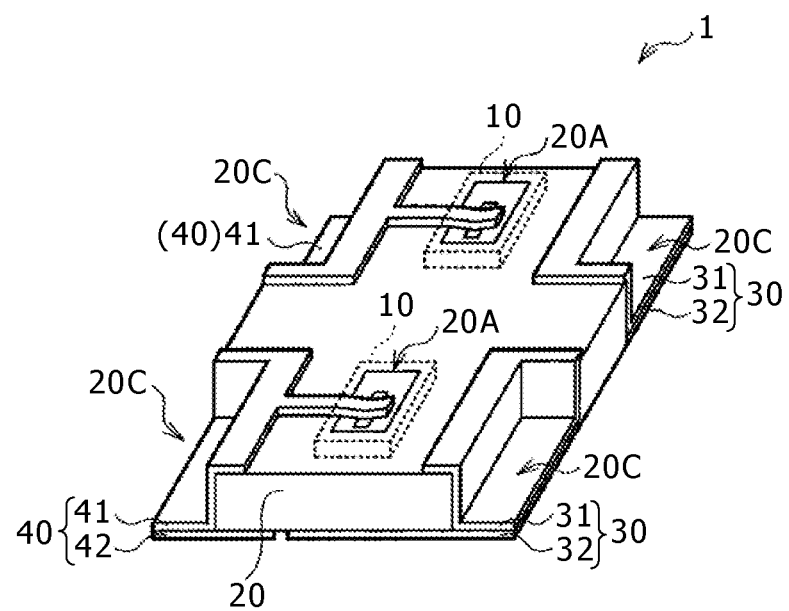
FIGS. 23A and 23B are respectively perspective views showing first and second forms of a seventh change of the structure of the light emitting device shown in FIGS. 1A and 1B.
Figure 23B:
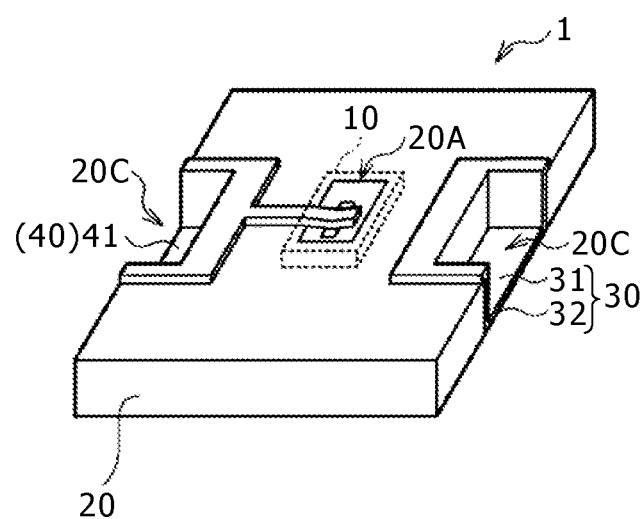

In addition, in the first embodiment and the first to sixth changes thereof, the light emitting device 1 includes the three light emitting elements 10. However, the light emitting device 1 either may also include four or more light emitting elements 10, or may also include one or two light emitting elements 10 as shown in FIGS. 23A and 23B.

(Eighth Change)

Figure 24:
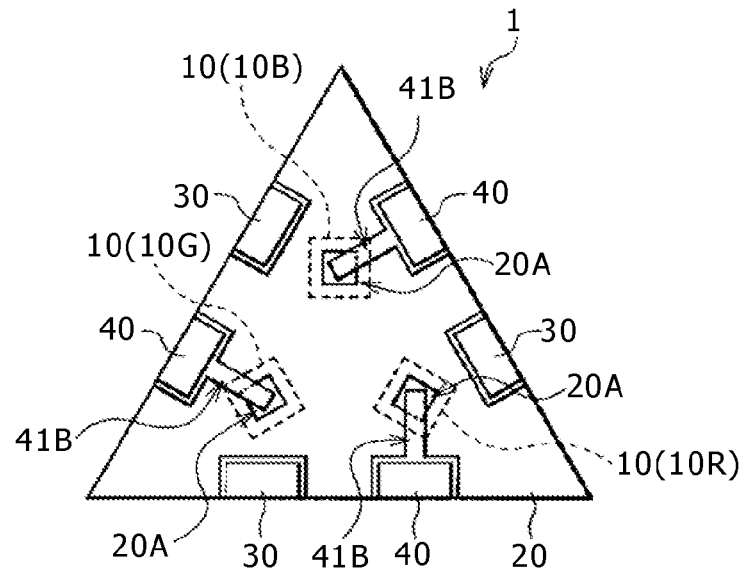
FIGS. 24 to 27 are respectively perspective views showing first to fourth forms of an eighth change of the structure of the light emitting device shown in FIGS. 1A and 1B.
Figure 25:
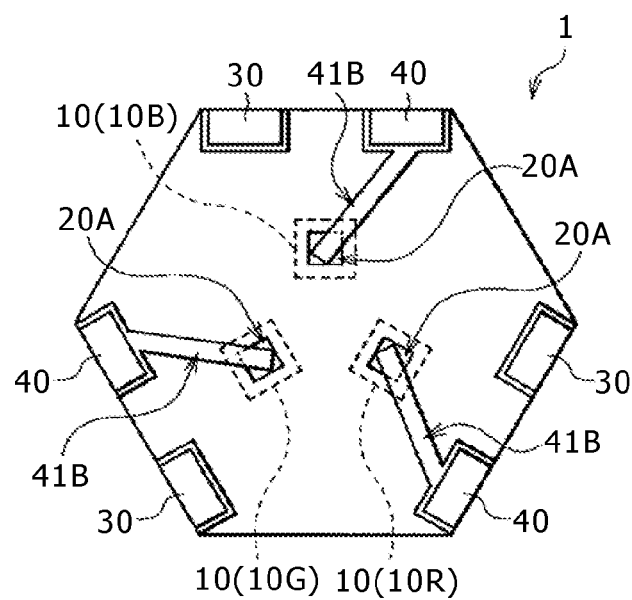

Although in the first embodiment, and the first to seventh changes thereof, the case where the light emitting device 1 (or the insulator 20) has the rectangular parallelepiped-like shape is exemplified, the light emitting device 1 (or the insulator 20) may also have any other suitable shape. For example, the light emitting device 1 (or the insulator 20) either, as shown in FIG. 24, may also have a triangular shape, or as shown in FIG. 25, may also have a hexagonal shape. In addition, although in the first embodiment, and the first to seventh changes thereof, the case where plural light emitting elements 10 are disposed in a line, the plural light emitting elements 10 may also be disposed in any other suitable arrangement. For example, as shown in FIGS. 24 and 25, the three light emitting elements 10 may also be disposed in positions corresponding to three corners of the triangle, respectively. In addition, for example, when as shown in FIG. 24, the three light emitting elements 10 are disposed in the positions corresponding to the three corners of the triangular, respectively, the light emitting device 1 (or the insulator 20) may have a shape similar to the triangle (that is, the triangular shape). In addition, for example, when as shown in FIG. 25, the three light emitting elements 10 are disposed in the positions corresponding to the three corners of the triangle, respectively, the light emitting device 1 (or the insulator 20) may have a shape different from the triangle (for example, the hexagonal shape).

Now when the three light emitting elements 10 are disposed in the positions corresponding to the three corners of the triangular, respectively, and the light emitting device 1 (or the insulator 20) has a shape similar to the triangle (that is, the triangular shape), the two terminal electrodes 30 and 40 provided every light emitting element 10, for example, as shown in FIG. 24, are disposed in each of the two side portions, close to the corresponding one of the three light emitting elements 10, of the three side portions of the insulator 20, that is, every corresponding one of the three side portions. In addition, when the three light emitting elements 10 are disposed in the positions corresponding to the three corners of the triangular, respectively, and the light emitting device 1 (or the insulator 20) has a shape (specifically, the hexagonal shape) different from the triangle, for example, as shown in FIG. 25, the two terminal electrodes 30 and 40 provided every light emitting element 10 are disposed in common one side portion of the six side portions of the insulator 20. At this time, the two terminal electrodes 30 and 40 are disposed in the side portion with which the two terminal electrodes 30 and 40 concerned, and the light emitting element 10 can be connected at the shortest distance to each other. In addition, at this time, preferably, the two terminal electrodes 30 and 40 are disposed alternately in a round direction in the six side portions of the insulator 20.

Figure 26:
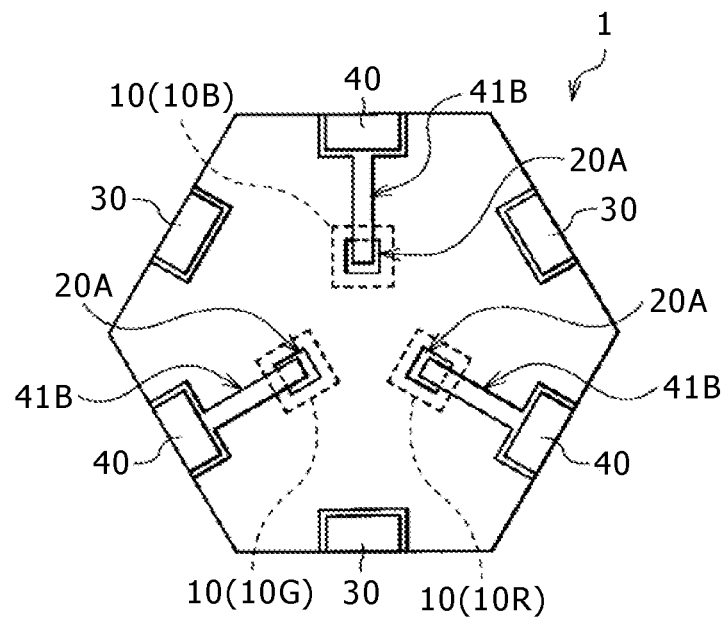
Figure 27:
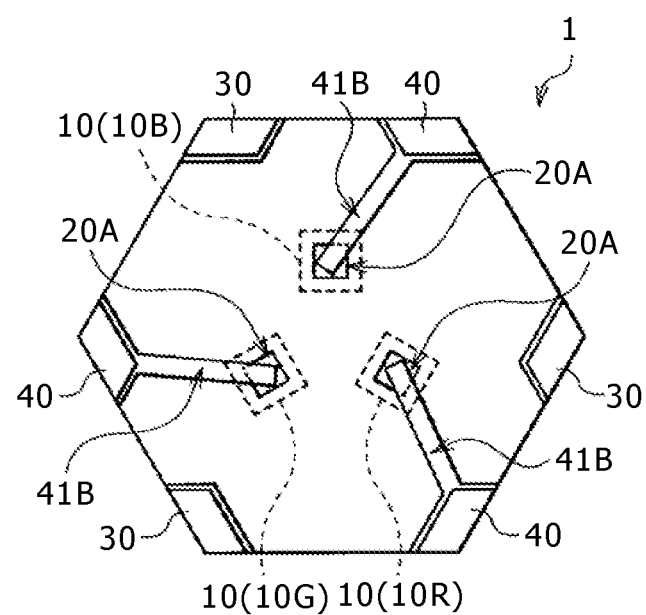

It is noted that when the three light emitting elements 10 are disposed in the positions corresponding to the three corners of the triangular, respectively, and the light emitting device 1 (or the insulator 20) has a shape different from the triangle (specifically, the hexagonal shape), for example, as shown in FIG. 26, each of the terminal electrodes 30 and 40 may be disposed in each of the six side portions of the insulator 20. At this time, preferably, the terminal electrodes 30 and 40 are alternately disposed in the round direction every adjacent two side portions of the six side portions of the insulator 20. In addition, when the three light emitting elements 10 are disposed in the positions corresponding to the three corners of the triangular, respectively, and the light emitting device 1 (or the insulator 20) has a shape (specifically, the hexagonal shape) different from the triangle, for example, as shown in FIG. 27, each of the terminal electrodes 30 and 40 may also be disposed in each of the six corner portions (in each of the portions each of which the adjacent two side portions contact) of the insulator 20. At this time, preferably, the terminal electrodes 30 and 40 are alternately disposed in the round direction every adjacent two corner portions of the six corner portions of the insulator 20.

(Ninth Change)

In addition, although in the first embodiment and the first to eighth changes thereof, the light emitting element 10 is used in which one electrode is formed on each of the upper surface and the lower surface of the light emitting element 10, a light emitting element may also be adopted which has the electrode only on the lower surface. As such a light emitting element, a light emitting element 80 as shown in FIGS. 28A and 28B, for example, is given.

Figure 28A:
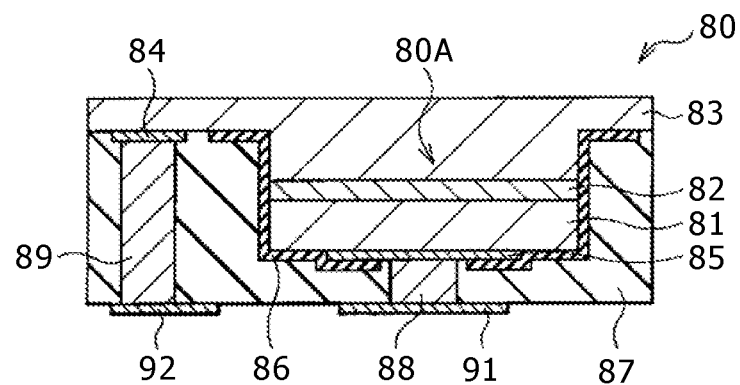
FIGS. 28A and 28B are exemplary cross sectional views each showing a change of the structure of the light emitting element shown in FIG. 1A.
Figure 28B:
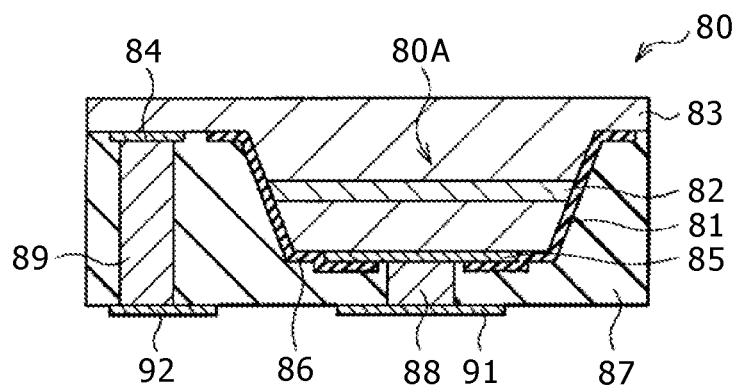

For example, as shown in FIGS. 28A and 28B, the light emitting element 80 has a semiconductor layer in which a layer 81 of the first conductivity type, an active layer 82, and a layer 83 of the second conductivity type are laminated in this order. In the semiconductor layer of the light emitting element 80, a portion including a part of the layer 83 of the second conductivity type, the active layer 82, and the layer 81 of the first conductivity type composes a columnar mesa portion 80A. A flat surface through which the layer 83 of the second conductivity type is exposed spread in a foot of the columnar mesa portion 80A of the semiconductor layer and a first electrode 84 is formed on a part of the flat surface. The first electrode 84 contacts the layer 83 of the second conductivity type and is electrically connected to the layer 83 of the second conductivity type. In a word, the first electrode 84 ohmic-contacts the layer 83 of the second conductivity type. It is noted that an upper surface of the layer 83 of the second conductivity type (in a word, a surface on a side opposite to the mesa portion 80A of the semiconductor layer) becomes a light taking-out surface, and none of light blocking structures such as an electrode is provided on the upper surface of the layer 83 of the second conductivity type. A second electrode 85 is provided on an upper surface of the mesa portion 80A (in a word, a surface of the layer 81 of the first conductivity type). The second electrode 85 contacts the layer 81 of the first conductivity type and is electrically connected to the layer 81 of the first conductivity type. In a word, the second electrode 85 ohmic-contacts the layer 81 of the first conductivity type. Each of the first electrode 84 and the second electrode 85 is made of a metallic material. Each of the first electrode 84 and the second electrode 85 either may be composed of a single electrode or may be composed of plural electrodes. It is noted that in the following description, as shown in FIGS. 28A and 28B, it is supposed that each of the first electrode 84 and the second electrode 85 is composed of a single electrode.

A side surface of the light emitting element 80 (specifically, the mesa portion 80A), for example, as shown in FIG. 28A, becomes a vertical surface perpendicular to the lamination direction. It is noted that the side surface of the mesa portion 80A may become an inclined surface intersecting with the lamination direction. At this time, preferably, the side surface of the mesa portion 80A becomes an inclined surface such that as shown in FIG. 28B, the mesa portion 80A has an inverse trapezoid-like shape in cross section. The side surface of the mesa portion 80A has a taper-like shape in such a way, thereby making it possible to enhance the light taking-out efficiency in the front surface direction.

For example, as shown in FIGS. 28A and 28B, the light emitting element 80 has an insulating film 86 which is formed over the side surface and foot of the mesa portion 80A. The light emitting element 80 further has a buried layer 87 covering the mesa portion 80A, bumps 88 and 89 each formed within the buried layer 87, and pad electrodes 91 and 92 each formed on the buried layer 87. Each of the bumps 88 and 89, and the pad electrodes 91 and 92 is made of a metallic material. The bump 88 is electrically connected to the second electrode 85, and an upper surface of the bump 88, for example, is formed within the same surface as the upper surface of the buried layer 87. The bump 89 is electrically connected to the first electrode 84, and an upper surface of the bump 89, for example, is formed within the same surface as the upper surface of the buried layer 87. The pad electrode 91 contacts the bump 88 and thus is electrically connected to the second electrode 85 through the bump 88. The pad electrode 92 contacts the bump 89 and thus is electrically connected to the first electrode 84 through the bump 89.

Figure 29A:
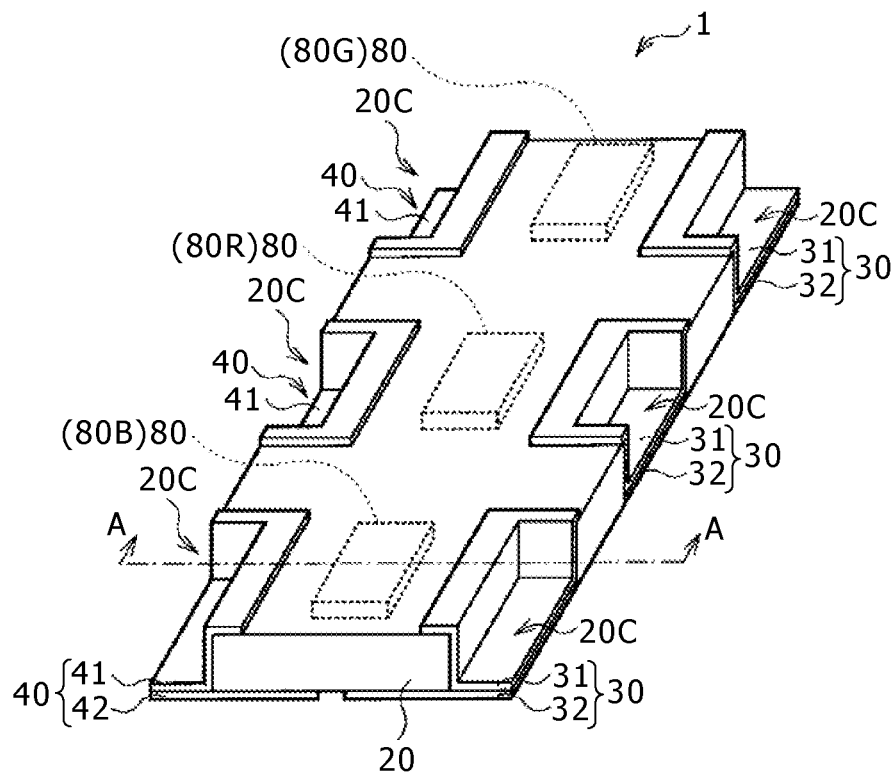
FIGS. 29A and 29B are respectively an exemplary perspective view showing a structure of the light emitting device when the light emitting element shown in FIGS. 28A and 28B is applied to the light emitting devices of the first embodiment and the first to eighth changes thereof, and a cross sectional view taken on line A-A of FIG. 29A.
Figure 29B:
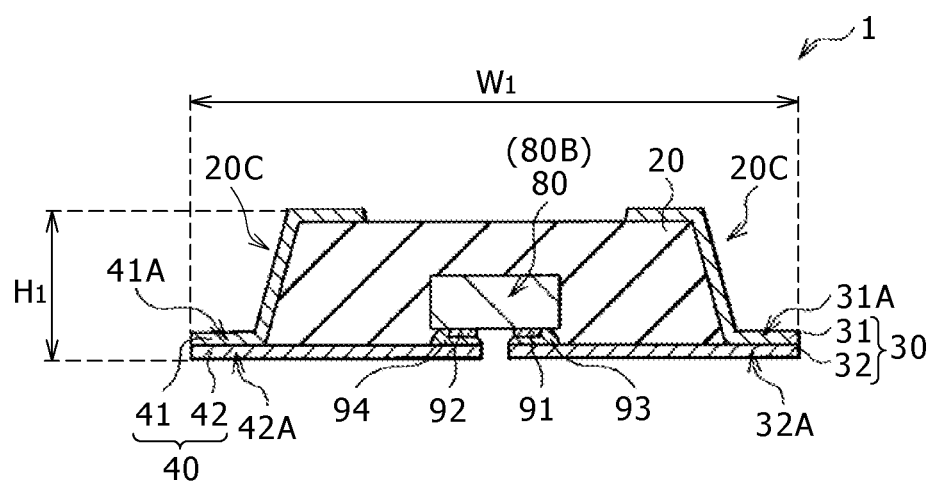
Figure 30A:
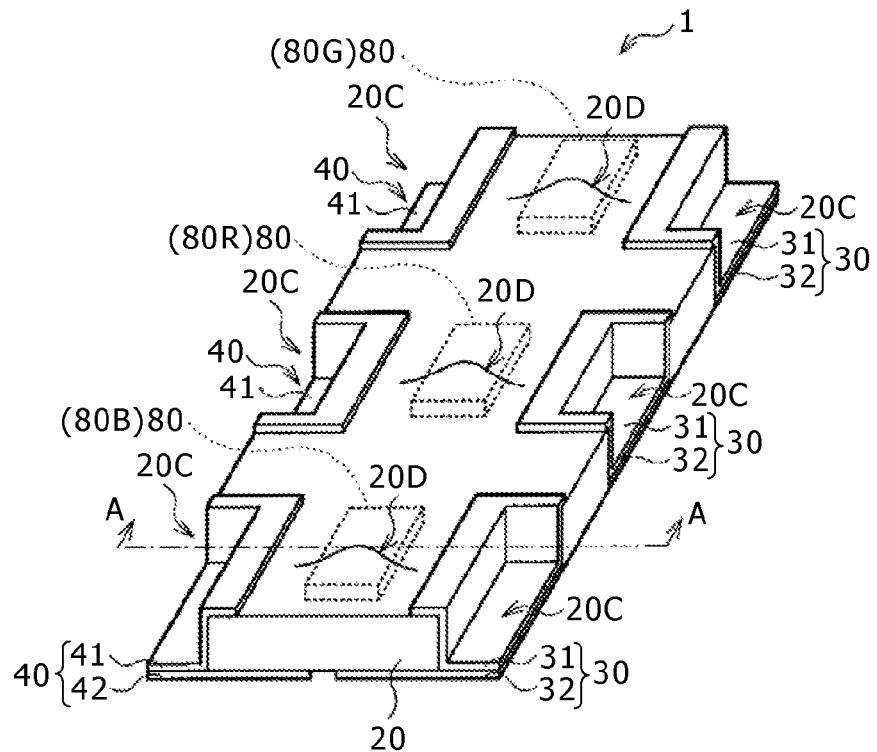
FIGS. 30A and 30B are respectively an exemplary perspective view showing a change of the structure of the light emitting device shown in FIGS. 29A and 29B, and a cross sectional view taken on line A-A of FIG. 30A.
Figure 30B:
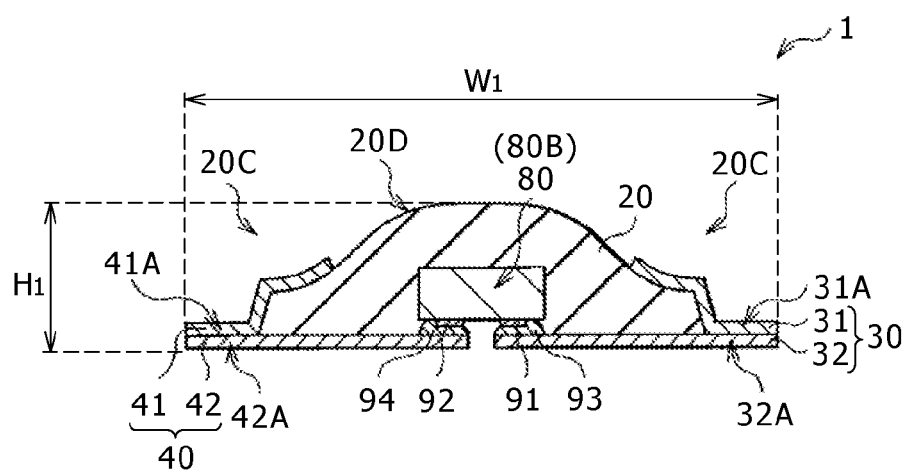

FIGS. 29A and 29B, and FIGS. 30A and 30B show examples when the light emitting element 80 is applied to the light emitting devices 1 of the first embodiment and the first to eighth changes thereof. FIGS. 29A and 30A perspectively show the examples of the structure of the light emitting device 1 in which the light emitting element 80 is installed, respectively. FIG. 29B shows an example of a cross-sectional structure when viewed from a direction indicated by a line A-A of FIG. 30A. Also, FIG. 30B shows an example of a cross-sectional structure when viewed from a direction indicated by a line A-A of FIG. 30B.

When as shown in FIGS. 29A and 29B, and FIGS. 30A and 30B, the light emitting element 80 is used which has an electrode only on a lower surface side, it is unnecessary to provide the opening 20A on the upper surface of the insulator 20, and it is also unnecessary to provide the connection portion 41B. Instead, however, it becomes necessary to adopt a structure such that one end of the lower electrode 42 is made to extend up to a position right below the light emitting element 80, and the lower electrode 42 is connected to a pad electrode 92 electrically connected to the layer 83 of the second conductivity type through a connection portion 94. In addition, it is necessary to adopt a structure such that the lower electrode 32 is connected to a pad electrode 91 electrically connected to the layer 81 of the first conductivity type through a connection portion 93. It is noted that other structures of the upper electrode 31, the lower electrode 32, the upper electrode 41, and the lower electrode 42 are the same as those in the first embodiment described above.

(Tenth Change)

Figure 31A:
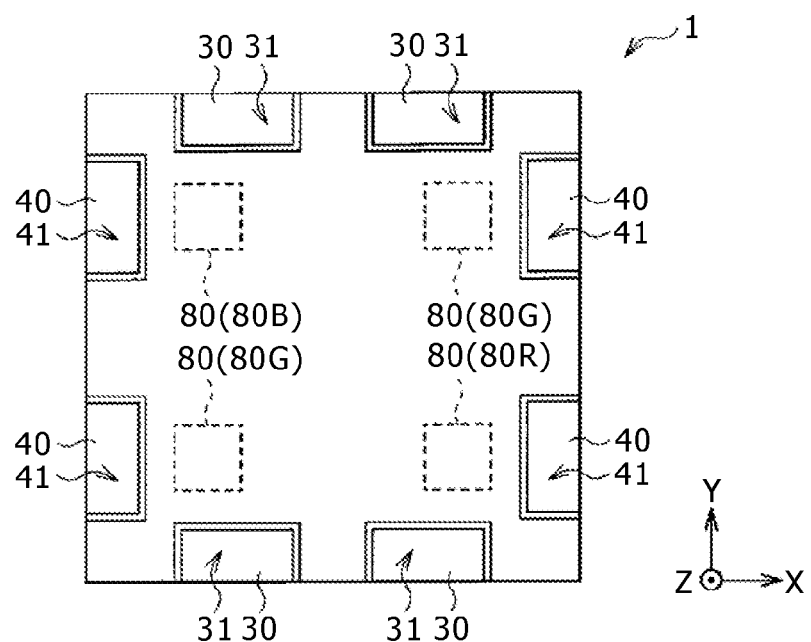
FIGS. 31A and 31B are respectively an exemplary top plan view and bottom plan view showing a further change of the structure of the light emitting device shown in FIGS. 29A and 29B.
Figure 31B:
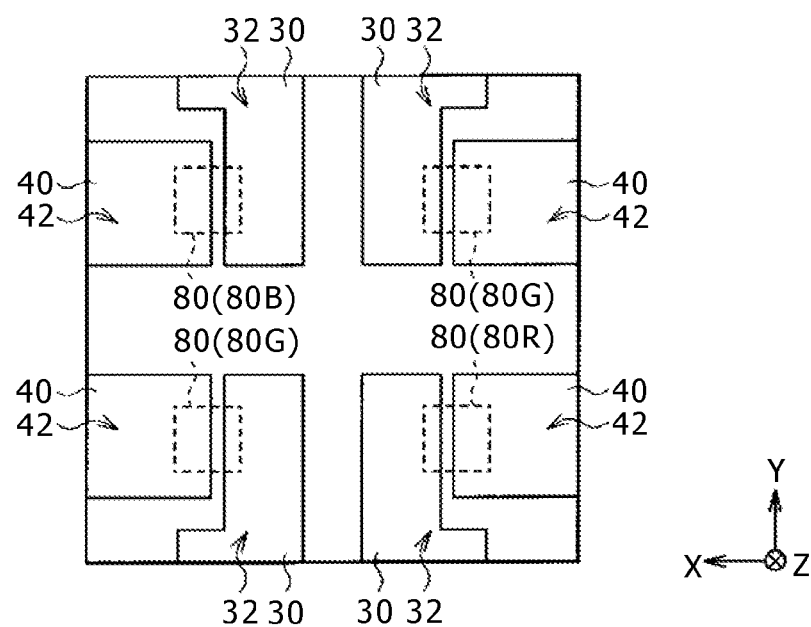

In addition, although in the first embodiment, and the first to ninth changes thereof except for the eighth change, the plural light emitting elements 10 or the plural light emitting elements 80 are disposed in a line, the plural light emitting elements 10 or the plural light emitting elements 80 may also be disposed in a matrix. FIGS. 31A and 31B show an example of a situation in which the plural light emitting elements 80 are disposed in a matrix in the light emitting device 1. FIG. 31A shows an example of an upper surface structure of the light emitting device 1, and FIG. 31B shows an example of a lower surface structure of the light emitting device 1.

FIGS. 31A and 31B show a situation in which one light emitting element 80R which emits a red light as a form of the light emitting element 80, two light emitting elements 80G each of which emits a green light as another form of the light emitting element 80, and one light emitting element 80B which emits a blue light as still another form of the light emitting element 80 are provided within the light emitting device 1. Referring to FIGS. 31A and 31B, the two terminal electrodes 30 and 40 which are provided every light emitting element 80 are disposed every adjacent two side portions, through corresponding one of four corner portions (the corresponding one of the four portions in which the adjacent two side portions contact each other), of four side portions of the insulator 20. With regard to the terminal electrodes 30 and 40, two kinds of terminal electrodes are alternately disposed in the round direction two by two in the four side portions of the insulator 20. It is noted that although not illustrated, the terminal electrodes 30 and 40 may also be alternately disposed in the round direction one by one in the four side portions of the insulator 20.

<3. Second Embodiment>

[Structure]

Figure 32:
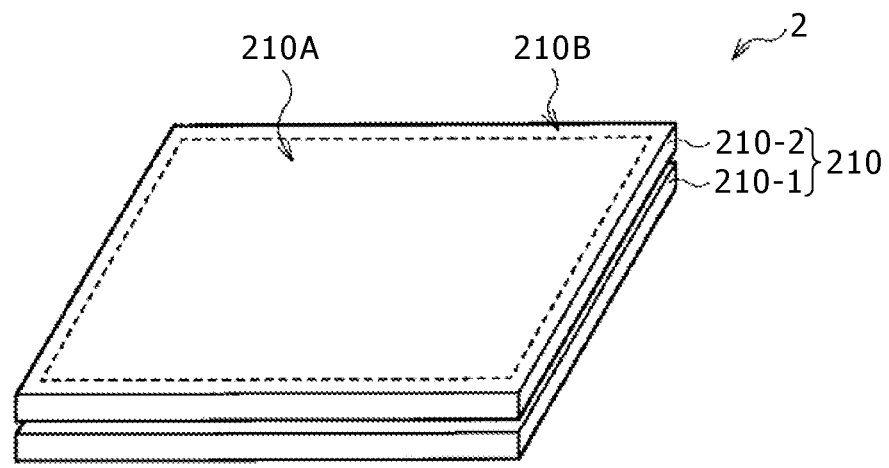
FIG. 32 is an exemplary perspective view showing a structure of a display device according to a second embodiment of the present disclosure.

Next, a description will be given with respect to a display device 2 according to a second embodiment of the present disclosure. The display device 2 includes the light emitting device 1 according to the first embodiment and the changes thereof as a display pixel. FIG. 32 perspectively shows a schematic structure of the display device 2. The display device 2 is a so-called LED display device, and uses an LED as a display pixel. The display device 2, for example, as shown in FIG. 32, includes a display panel 210, and a drive circuit (not shown) for driving the display panel 210.

(Display Panel 210)

The display panel 210 is structured in such a way that a mounting substrate 210-1 and a transparent substrate 210-2 are stacked on each other. A surface of the transparent substrate 210-2 composes an image display surface. The transparent substrate 210-2 has a display area 210A at a central portion thereof, and a frame area 210B as a non-display area in the circumference of the display area 210A.

Figure 33:
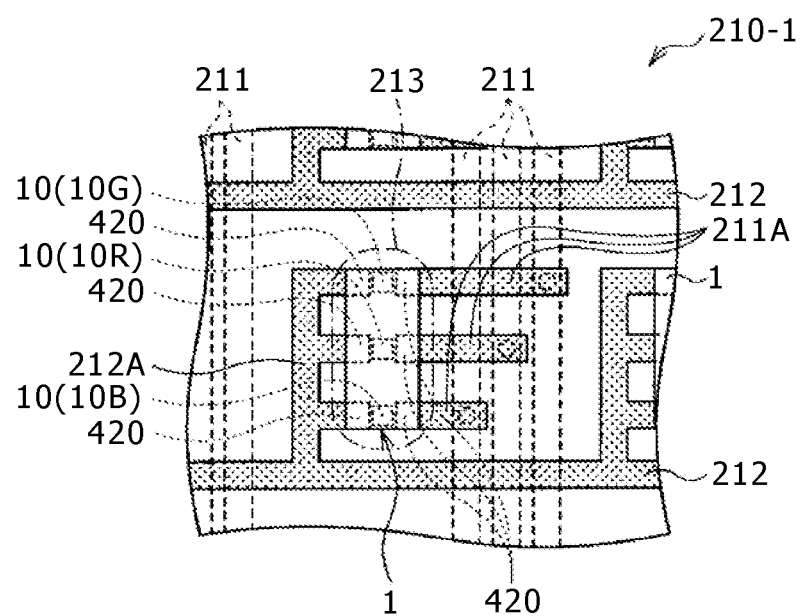
FIG. 33 is an exemplary top plan view showing a layout of a surface of a mounting substrate shown in FIG. 32.

FIG. 33 shows an example of a layout of an area corresponding to the display area 210A of the surface, on the transparent substrate 210-2 side, of the mounting substrate 210-1.

(Mounting Substrate 210-1)

In the area, corresponding to the display area 210A, of the surface of the mounting substrate 210-1, for example, as shown in FIG. 33, plural data wirings 211 are formed so as to extend in a predetermined direction, and are disposed in parallel with one another at predetermined pitches. In the area, corresponding to the display area 210A, of the surface of the mounting substrate 210-1, for example, as shown in FIG. 33, plural scanning wirings 212 are further formed so as to extend in a direction intersecting with (for example, perpendicular to) the plural data wirings 211, and are disposed in parallel with one another at predetermined pitches. Each of the data wirings 211 and the scanning wirings 212, for example, is made of a conductive material such as copper (Cu).

The scanning wirings 212, for example, are formed on the uppermost layer and, for example, are formed on an insulating layer (not shown) formed on a surface of a base material. It is noted that a base material of the mounting substrate 210-1, for example, is composed of a glass substrate, a resin substrate or the like, and the insulating layer formed on the base material, for example, is made of SiN, $SiO_2$, or $Al_2O_3$. On the other hand, the data wirings 211 are formed within a layer (for example, a lower layer with respect to the uppermost layer) different from the uppermost layer including the scanning wirings 212 and, for example, are formed within the insulating later on the base material. In addition to the scanning wirings 212, for example, a black is provided on the surface of the insulating layer as may be necessary. The black is provided in order to increase the contrast and is made of a light-absorbing material. The black, for example, is formed in at least a non-formation area, of pad electrode 215 which will be described later, of the surface of the insulating layer. It is noted that the black can be omitted as may be necessary.

A display pixel 213 is formed in the vicinity of an intersection portion between the data wiring 211 and the scanning wiring 212. Also, plural display pixels 213 are disposed in a matrix within the display area 210A. For example, as shown in FIG. 33, the light emitting device 1 including plural light emitting elements 10 is mounted in each of the display pixels 213. It is noted that the case where one display pixel 213 is composed of the three light emitting elements 10: the light emitting element 10R; the light emitting element 10G; and the light emitting element 10B, and the red light, the green light, and the blue light can be emitted from the light emitting element 10R, the light emitting element 10G, and the light emitting element 10B, respectively, is exemplified in FIG. 33. The light emitting element 10, for example, is composed of an LED chip.

Figure 34A:
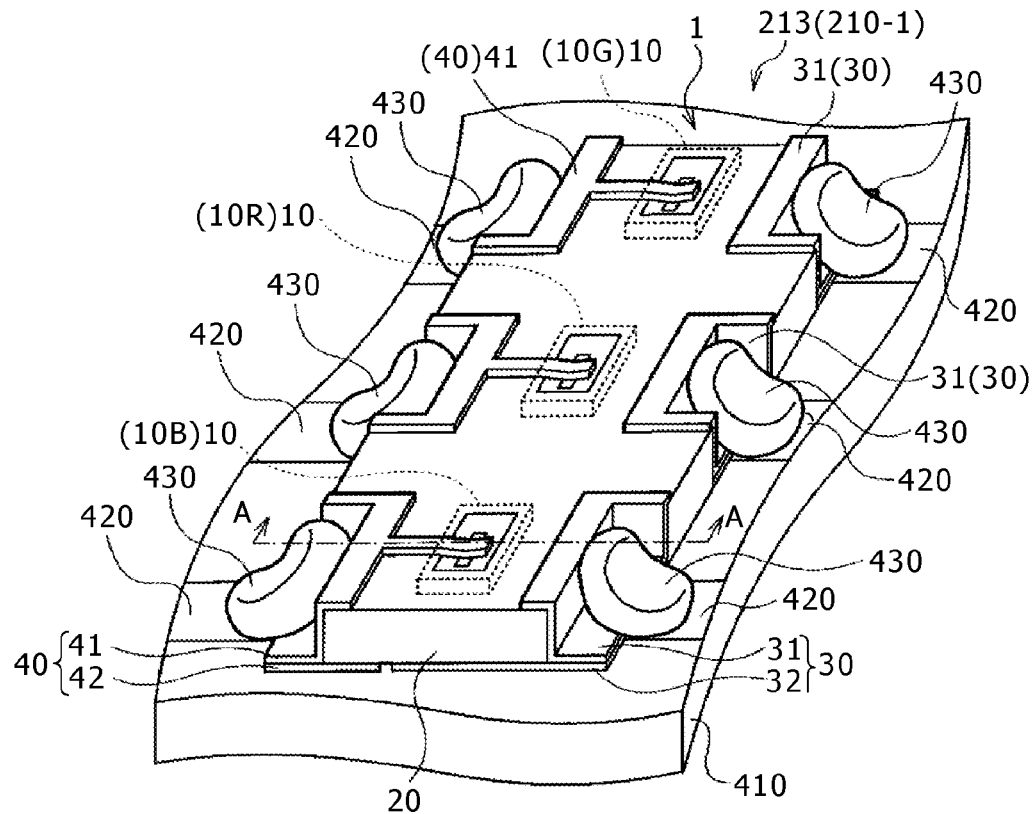
FIGS. 34A and 34B are respectively an exemplary perspective view showing a structure of a display pixel shown in FIG. 32, and a cross sectional view taken on line A-A of FIG. 34A.
Figure 34B:
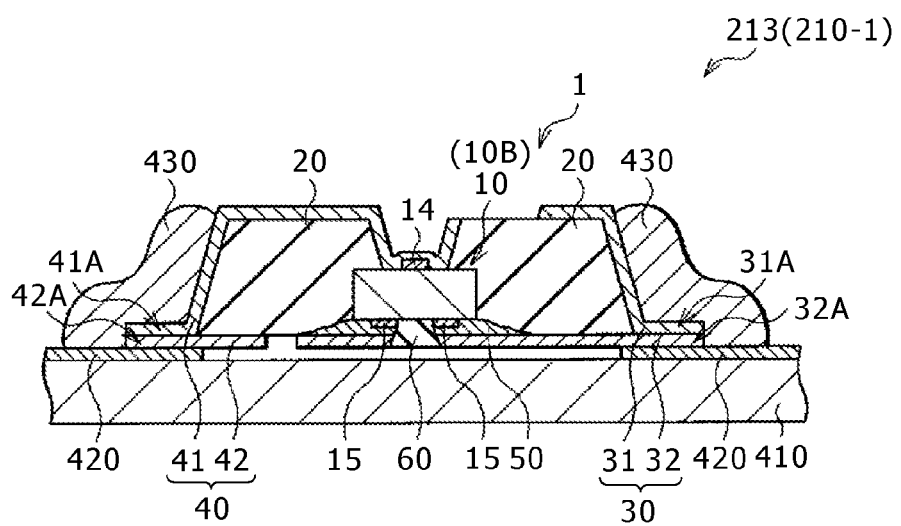

The light emitting device 1, for example, as shown in FIGS. 34A and 34B is provided with a pair of terminal electrodes 30 and 40 every light emitting element 10. Also, one terminal electrode 30 is electrically connected to the data wiring 211, and the other terminal electrode 40 is electrically connected to the scanning wiring 212. For example, the terminal electrode 30 is connected to a pad electrode 420 at a top of a branch 211A provided in the data wiring 211 through the wiring layer 430. In addition, for example, the terminal electrode 40 is connected to a pad electrode 420 at a top of a branch 212A provided in the scanning wiring 212 through the wiring layer 430.

Each of the pad electrodes 420, for example, is formed in the uppermost layer and, for example, as shown in FIG. 33 and FIGS. 34A and 34B, is provided in a portion to which corresponding one of the light emitting devices 1 is mounted. Here, the pad electrode 420, for example, is made of a conductive material such as gold (Au). The wiring layer 430, for example, is made of an alloy containing therein lead and tin as major constituents.

The mounting substrate 210-1, for example, is provided with plural columns (not shown) for regulating an interval between the mounting substrate 210-1 and the transparent substrate 210-2. The plural columns either may be provided within an area facing the display area 210A, or may be provided within an area facing the frame area 210B.

(Transparent Substrate 210-2)

The transparent substrate 210-2, for example, is composed of a glass substrate, resin substrate or the like. Although in the transparent substrate 210-2, a surface on the light emitting device 1 side may be flat, the surface on the light emitting device 1 side is preferably a rough surface. The rough surface either may be provided over the entire area facing the display area 210A, or may be formed in only an area facing the display pixel 213. The rough surface has fine irregularities to the degree that when the light emitted from the light emitting element 10 is made incident to the rough surface, the rough surface scatters the incident light. The irregularities of the rough surface can be made by carrying out sandblast, dry etching or the like.

(Drive Circuit)

The drive circuit drives plural display pixels 213 in accordance with the video signal. The drive circuit, for example, is composed of a data driver and a scanning driver. In this case, the data driver drives the data wirings 211 connected to the display pixels 213. Also, the scanning driver drives the scanning wirings 212 connected to the display pixels 213. The drive circuit, for example, either may be mounted onto the mounting substrate 210-1, or may be provided separately from the display panel 210 and connected to the mounting substrate 210-1 through the wiring (not shown).

[Method of Manufacturing Display Panel 210]

Next, a description will be given with respect to an example of a method of manufacturing the display panel 210.

Firstly, for example, there is prepared a circuit substrate (not shown) having an insulating layer including plural data wirings 211 in the inside thereof, the wiring pattern (including the scanning wirings 212 and the pad electrodes 215), and the black 218 on a base material. Next, plural light emitting devices 1 are mounted on the circuit substrate. At this time, plural light emitting devices 1 are mounted onto the circuit substrate by utilizing the same method as that previously described in the first embodiment. After that, the circuit substrate is reflowed, thereby joining the terminal electrodes 30 and 40 of the light emitting devices 1 to the pad electrodes 420, respectively, through the wiring layer 430. As a result, the mounting substrate 210-1 is formed. Next, the mounting substrate 210-1 and the transparent substrate 210-2 are made to face each other and are then stuck to each other. In such a way, the display panel 210 is manufactured.

[Operation and Effects of Display Device 2]

In the display device 2 of the second embodiment, the light emitting devices 1 are driven (simple matrix-driven) through the data wirings 211 and the scanning wirings 212 which are disposed in a simple matrix by the drive circuit. As a result, a current is successively supplied to each light emitting device 1 provided in the vicinity of the intersection portion between the data wiring 211 and the scanning wiring 212, thereby displaying an image on the display area 210A.

Now, in the display device 2 of the second embodiment, the LED used in the display pixel 213 is built in the light emitting device 1. Thus, the light emitting device 1 is mounted onto the circuit substrate by utilizing the same method as that previously described in the first embodiment. As a result, for example, the cantilevers are merely caused to come in contact with the portions, which are not covered with the wiring layer 430, of the upper electrodes 31 and 41, thereby making it possible to measure the characteristics of the individual light emitting elements 10 after completion of the mounting. Therefore, it is possible to readily measure the characteristics of the individual light emitting elements 10 after completion of the mounting.

In addition, when in the display device 2 of the second embodiment, the surface of the transparent substrate 210-2 is the rough surface, a part of the light which is emitted in the oblique direction from the light emitting device 1 is scattered by the rough surface. As a result, the part of the scattered light is transmitted through the transparent substrate 210-2 to be emitted to the outside. Therefore, it is possible to reduce that the light which is emitted in the oblique direction from the light emitting device 1 is reflected by the back surface of the transparent substrate 210-2, or confined in the transparent substrate 210-2 to generate a stray light. Therefore, it is possible to suppress the reduction of the light taking-out efficiency due to the transparent substrate 210-2.

In addition, when in the display device 2 of the second embodiment, the black 218 is provided on the surface of the mounting substrate 210-1, it is unnecessary to provide the black 218 on the transparent substrate 210-2 side. As a result, since the alignment becomes unnecessary when the mounting substrate 210-1 and the transparent substrate 210-2 are stuck to each other in the manufacturing processes, the productivity is enhanced.

[Change of Second Embodiment]

Figure 35:
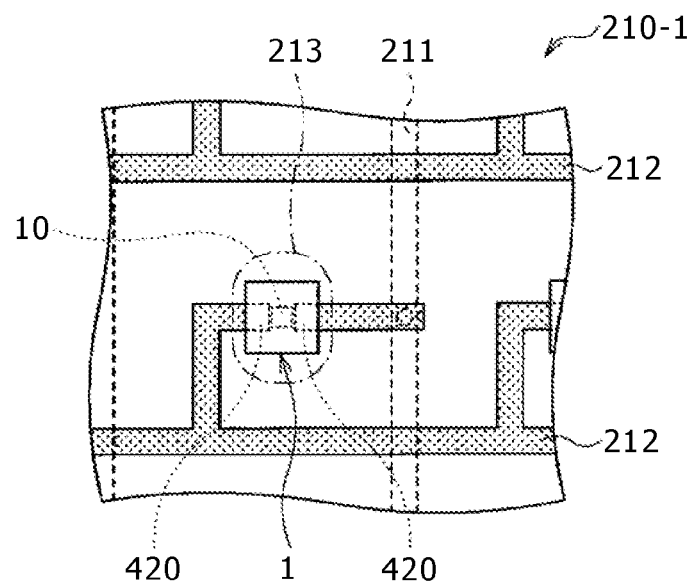
FIG. 35 is a top plan view showing a first example of the layout of the surface of the mounting substrate shown in FIG. 32.

Although in the display device 2 of the second embodiment, the light emitting device 1 includes the three light emitting elements 10, the light emitting device 1 either may include two or less light emitting elements 10 or may include four or more light emitting elements 10. For example, as shown in FIG. 35, the light emitting device 1 may also include only one light emitting element 10.

Figure 36:
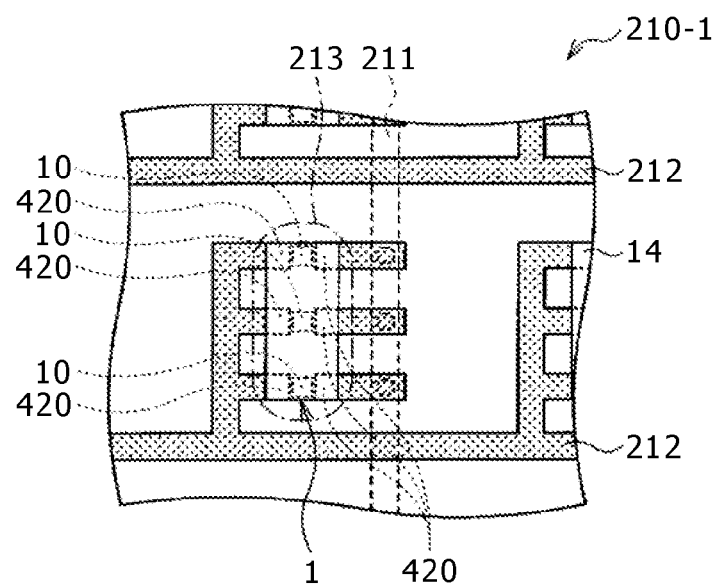
FIG. 36 is a top plan view showing a second example of the layout of the surface of the mounting substrate shown in FIG. 32.

In addition, although in the display device 2 of the second embodiment, each of the light emitting elements 10 within the light emitting device 1 is connected to each of the data wirings 211 different from one another, for example, as shown in FIG. 36, the light emitting elements 10 within the light emitting device 1 may also be connected to the same data wiring. In this case, all of the light emitting elements 10 within the light emitting device 1 may be composed of the same kind of LED in such a way that the lights having the same color are emitted from one display pixel 213.

Figure 37:
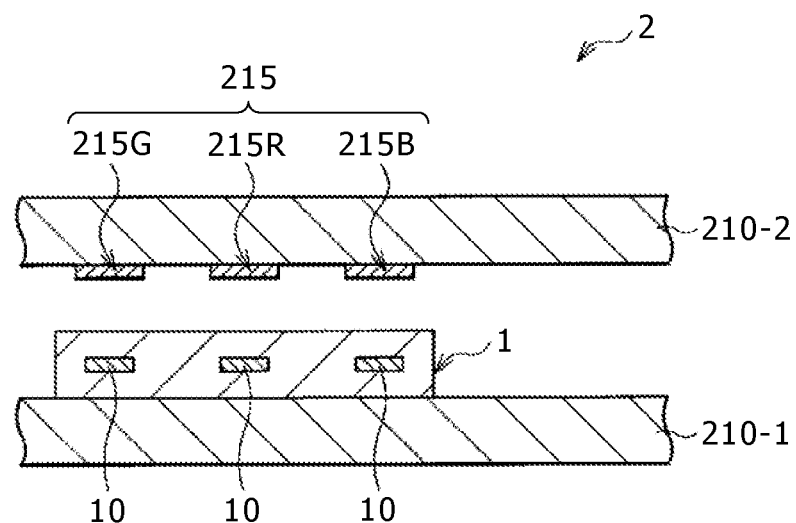
FIG. 37 is an exemplary cross sectional view showing a change of the structure of the display device shown in FIG. 32.

In addition, although in the display device 2 of the second embodiment, the three light emitting elements 10 emit the lights having the wavelength bands different from one another, the three light emitting elements may also emit the lights having the wavelength bands equal to one another. In this case, however, for example, as shown in FIG. 37, phosphors 215 are preferably provided on the surface of the transparent substrate 210-2. With regard to the phosphors 215, for example, as shown in FIG. 37, three phosphors 215G, 215R, and 215B are provided for one light emitting device 1. The phosphor 215G is a phosphor for emission of a green light, the phosphor 215R is a phosphor for emission of a red light, and the phosphor 215B is a phosphor for emission of a blue light. At this time, when each of the light emitting elements 10, for example, is composed of an LED chip for emitting the blue light, the light emitted from the light emitting elements 10 are made incident to the phosphors 215G, 215R, and 215B. As a result, the phosphors 215G, 215R, and 215B are excited, so that the color lights having the luminances corresponding to quantities of incident lights are emitted from the phosphors 215G, 215R, and 215B, respectively.

<4. Third Embodiment>

[Structure]

Figure 38:
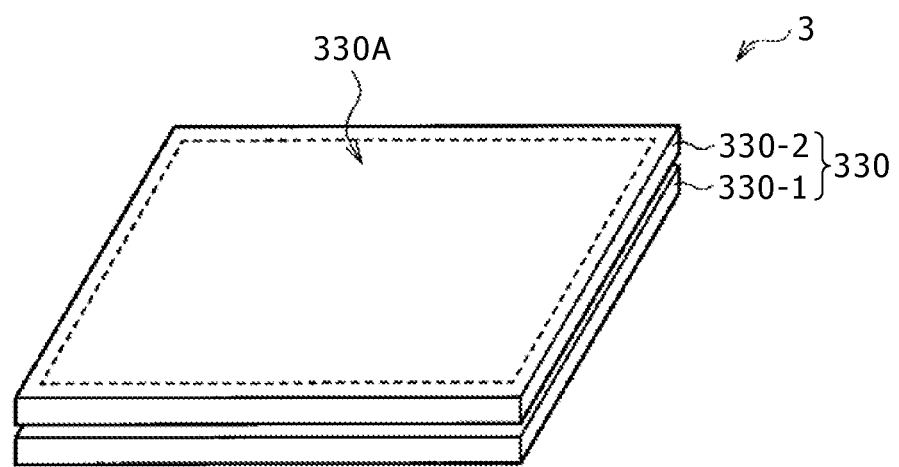
FIG. 38 is an exemplary perspective view showing a structure of an illuminating device according to a third embodiment of the present disclosure.

Next, a description will be given with respect to an illuminating device 3 according to a third embodiment of the present disclosure. The illuminating device 3 includes the light emitting device 1 according to the first embodiment and the changes thereof as a light source. FIG. 38 perspectively shows a schematic structure of the illuminating device 3. The illuminating device 3 is a so-called LED illuminating device, and uses an LED as a light source. The illuminating device 3, for example, as shown in FIG. 38, includes an illumination panel 330 and a drive circuit (not shown) for driving the illumination panel 330.

(Illumination Panel 330)

The illumination panel 330 is structured in such a way that a mounting substrate 330-1 and a transparent substrate 330-2 are stacked on each other. A surface of the transparent substrate 330-2 is a surface through which an illumination light is outputted, and the illumination panel 330 has an illumination area 330A at the central portion thereof.

Figure 39:
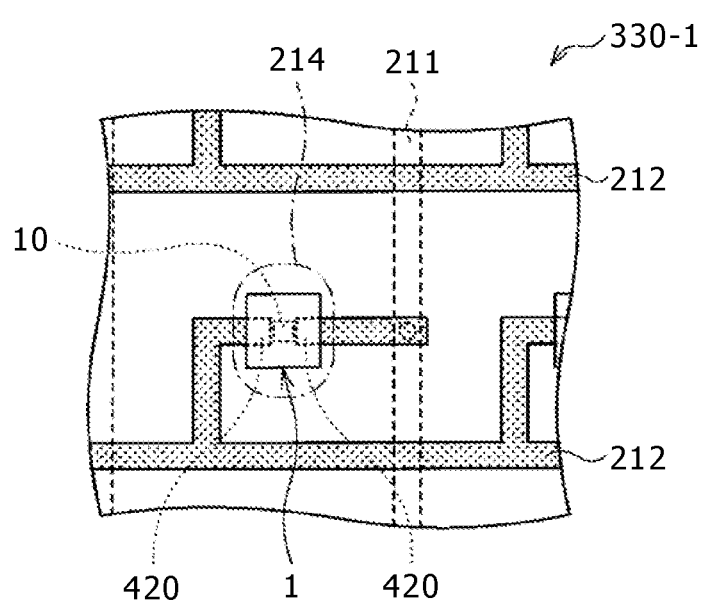
FIG. 39 is an exemplary top plan view showing a layout of a surface of a mounting substrate shown in FIG. 38.

FIG. 39 shows an example of a layout of an area, corresponding to the illumination area 330A, of the surface on the transparent substrate 330-2 side of the mounting substrate 330-1. In the illuminating device 3 of the third embodiment, a pixel corresponding to the display pixel 213 illustrated in FIG. 33 becomes an illuminating pixel 214.

(Drive Circuit)

A drive circuit drives plural illuminating pixels 214. The drive circuit, for example, is composed of a data driver and a scanning driver. In this case, the data driver drives the data wirings 211 connected to the illuminating pixels 214. The scanning driver drives the scanning wirings 212 connected to the illuminating pixels 214. The drive circuit either may be mounted onto the mounting substrate 330-1 or may be provided separately from the illumination panel 330.

[Method of Manufacturing Illumination Panel 330]

Next, an example of a method of manufacturing the illumination panel 330 will be described.

Firstly, for example, there is prepared a circuit substrate having an insulating layer including the plural data wirings 211 in the inside thereof, and the wiring pattern (including the scanning wirings 212 and the pad electrodes 215) on a base material. Next, the plural light emitting devices 1 are mounted onto the circuit substrate. At this time, the plural light emitting devices 1 are mounted onto the circuit substrate by utilizing the same method as that previously described in the first embodiment. After that, the circuit substrate is reflowed, thereby joining the terminal electrodes 30 and 40 of the light emitting devices 1 to the pad electrodes 420, through the wiring layer 430. As a result, the mounting substrate 330-1 is formed. Next, the mounting substrate 330-1 and the transparent substrate 330-2 are made to face each other and are then stuck to each other. In such a way, the illumination panel 330 is manufactured.

[Operation and Effects of Illuminating Device 3]

In the illuminating device 3 of the third embodiment, the light emitting devices 1 are driven through the data wirings 211 and the scanning wirings 212 which are disposed in a simple matrix by the drive circuit. As a result, a current is successively supplied to the light emitting devices 1 provided in the vicinities of the intersection portions between the data wirings 211 and the scanning wirings 212, respectively, thereby outputting an illumination light from the illumination area 310A.

Now, in the illuminating device 3 of the third embodiment, the LED used as the light source is built in the light emitting device 1. Thus, the light emitting device 1 is mounted onto the circuit substrate by utilizing the same method as that previously described in the first embodiment. As a result, for example, the cantilevers are merely caused to come in contact with the portions, which are not covered with the wiring layer 430, of the upper electrodes 31 and 41, thereby making it possible to measure the characteristics of the individual light emitting elements 10 after completion of the mounting. Therefore, it is possible to readily measure the characteristics of the individual light emitting elements 10 after completion of the mounting.

Although the present disclosure has been described so far by giving the plural embodiments and the changes thereof, the present disclosure is by no means limited to the plural embodiments and the changes thereof, and thus various kinds of changes can be made.

For example, although in the embodiments and the changes thereof, the light emitting device 1 includes the plural light emitting elements 10, the light emitting device 1 may also include only one light emitting element 10. In addition, although in the embodiments and the changes thereof, plural light emitting devices 1 are disposed in a matrix on the mounting substrates 210-1 and 330-1, the plural light emitting devices 1 may also be disposed in a line on the mounting substrates 210-1 and 330-1. In addition, although in the embodiments and the changes thereof, the data wirings 211 and the scanning wirings 212 which are disposed in a simple matrix are used on the mounting substrates 210-1 and 330-1 as the wirings through which the light emitting devices 1 are driven, any other suitable wiring pattern may also be used.

In addition, although in the embodiments and the changes thereof, the insulator 20 is provided, the insulator 20 may be omitted. In this case, each of the terminal electrodes 30 and 40 becomes a hollow wiring.

The present disclosure contains subject matter related to that disclosed in Japanese Priority Patent Application JP 2011-000634 filed in the Japan Patent Office on Jan. 5, 2011, the entire content of which is hereby incorporated by reference.

What is claimed is:

1. A light emitting device, comprising:
   one or plural light emitting elements having plural electrodes;
   a chip-like insulator surrounding said one or plural light emitting elements from at least a side surface side of said one or plural light emitting elements; and
   plural terminal electrodes electrically connected one-to-one with said plural electrodes, said plural terminal electrodes having protrusions protruding from a peripheral edge of said chip-like insulator.
   wherein,
   each of said plural terminal electrodes comprises a first terminal electrode and a second terminal electrode, the first and second terminal electrodes contacting each other at a corresponding one of said protrusions.

2. The light emitting device according to claim 1, wherein:
   said first terminal electrode either extends along an upper surface and a side surface of said insulator or extends through an inside of said insulator, said first terminal electrode protruding from said peripheral edge of said insulator; and
   said second terminal electrode extends along a lower surface of said insulator, and protrudes from said peripheral edge of said insulator.

3. The light emitting device according to claim 2, wherein said second terminal electrode has a flat plate-like shape.

4. The light emitting device according to claim 2, wherein:
   each of said one or plural light emitting elements has a lamination structure which includes a layer of a first conductivity type, an active layer, and a layer of a second conductivity type;
   said plural electrodes of said one or plural light emitting elements include (a) a first electrode on an upper surface side of the light emitting element and electrically connected to said layer of the second conductivity type, and (b) a second electrode on a lower surface side of the light emitting element and electrically connected to said layer of the first conductivity type;

a part of said plural terminal electrodes is electrically connected to said first electrode; and a part of said plural terminal electrodes is electrically connected to said second electrode.

5. The light emitting device according to claim 4, wherein:
the first terminal electrode, electrically connected to said first electrode, of said plural terminal electrodes, is disposed on a specific side of said insulator; and
the second terminal electrode, electrically connected to said second electrode of said plural terminal electrodes, is disposed on a side other than the specific side of sides of said insulator.

6. The light emitting device according to claim 4, wherein:
said first electrode comprises a metal, and
said second electrode comprises a metal.

7. The light emitting device according to claim 6, further comprising:
a metallic portion between said second electrode and said second terminal electrode, the metallic portion electrically connecting said second electrode and said second terminal electrode to each other and reflecting a light emitted from said active layer to a side of said layer of the second conductivity type.

8. The light emitting device according to claim 2, wherein:
each of said one or plural light emitting elements has a lamination structure which includes a layer of a first conductivity type, an active layer, and a layer of a second conductivity type in this order;
said plural electrodes of said one or plural light emitting elements include (a) a first electrode on an upper surface of the light emitting element and electrically connected to said layer of the second conductivity type, and (b) a second electrode on a lower surface of the light emitting element and electrically connected to said layer of the first conductivity type;
a part of said plural terminal electrodes is electrically connected to said first electrode; and
a part of said plural terminal electrodes is electrically connected to said second electrode.

9. The light emitting device according to claim 8, wherein:
the first terminal electrode, electrically connected to said first electrode, of said plural terminal electrodes is disposed on a specific side of said insulator; and
the second terminal electrode, electrically connected to said second electrode, of said plural terminal electrodes is disposed on a side other than the specific side of sides of said insulator.

10. The light emitting device according to claim 2, wherein said first terminal electrode extends along an upper surface of said insulator and a side surface of said insulator, and has a bump at a position facing the upper surface of said insulator.

11. The light emitting device according to claim 1, wherein:
said light emitting device includes plural light emitting elements;
said plural light emitting elements are disposed in a line;
said insulator has a strip-like shape extending in an arrangement direction of said plural light emitting elements; and
each of said protrusions extends beyond a width of said insulator.

12. The light emitting device according to claim 11, wherein the protrusions are disposed at positions opposite to each other with respect to corresponding one of said one or plural light emitting elements.

13. The light emitting device according to claim 11, wherein said insulator has cutouts corresponding to said protrusions.

14. The light emitting device according to claim 13, wherein an aspect ratio of said light emitting device is set equal to or smaller than 1, the aspect ratio representing a maximum value of a thickness of said light emitting device in relation to a minimum value of a width of said light emitting device.

15. The light emitting device according to claim 1, wherein said insulator has an inclined surface which covers at least an outer edge of an upper surface of each of said one or plural light emitting elements and a side surface of each of said one or plural light emitting elements, the inclined surface declining from a portion corresponding to the upper surface of each of said one or plural light emitting elements toward a peripheral edge of each of said one or plural light emitting elements.

16. The light emitting device according to claim 1, wherein each of said one or plural light emitting elements has an inclined surface such that a corresponding one of each of said one or plural light emitting elements has an inverse trapezoid-like shape in cross section.

17. An illuminating device, comprising:
plural light emitting devices on a substrate,
wherein,
each of said plural light emitting devices includes one or plural light emitting elements having plural electrodes,
a chip-like insulator surrounding said one or plural light emitting elements from a side surface side of said one or plural light emitting elements,
plural terminal electrodes electrically connected one-to-one with said plural electrodes, said plural terminal electrodes having protrusions protruding from a peripheral edge of said chip-like insulator, said protrusions being electrically connected to said substrate through a wiring layer, and
each of said plural terminal electrodes comprises a first terminal electrode and a second terminal electrode, the first and second terminal electrodes contacting each other at a corresponding one of said protrusions.

18. A display device, comprising:
a display panel having plural pixels; and
a drive circuit driving said plural pixels in accordance with a video signal,
wherein,
said plural pixels included in said display panel include plural light emitting devices mounted onto a substrate, and
each of said light emitting devices includes
one or plural light emitting elements having plural electrodes,
a chip-like insulator surrounding said one or plural light emitting elements from at least a side surface side of said one or plural light emitting elements,
plural terminal electrodes electrically connected one-to-one with said plural electrodes, and having protrusions each protruding from a peripheral edge of said chip-like insulator, said protrusions being electrically connected to said substrate through a wiring layer, and
each of said plural terminal electrodes comprises a first terminal electrode and a second terminal electrode, the first and second terminal electrodes contacting each other at a corresponding one of said protrusions.

* * * * *